(12) United States Patent
Van den berg

(10) Patent No.: US 11,176,478 B2
(45) Date of Patent: Nov. 16, 2021

(54) METHOD FOR ESTIMATING A QUANTUM PHASE

(71) Applicant: INTERNATIONAL BUSINESS MACHINES CORPORATION, Armonk, NY (US)

(72) Inventor: Ewout Van den berg, Bronxville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 415 days.

(21) Appl. No.: 16/281,851

(22) Filed: Feb. 21, 2019

(65) Prior Publication Data

US 2020/0272928 A1 Aug. 27, 2020

(51) Int. Cl.
*G06N 10/00* (2019.01)
*G01R 13/00* (2006.01)

(52) U.S. Cl.
CPC ............. *G06N 10/00* (2019.01); *G01R 13/00* (2013.01)

(58) Field of Classification Search
CPC ................................. G06N 10/00; G01R 13/00
See application file for complete search history.

(56) References Cited

U.S. PATENT DOCUMENTS

| | | | |
|---|---|---|---|
| 9,275,011 B2 | 3/2016 | Svore et al. | |
| 2011/0138344 A1 | 6/2011 | Ahn | |
| 2014/0297708 A1* | 10/2014 | Svore | G06N 10/00 708/517 |

FOREIGN PATENT DOCUMENTS

| | | |
|---|---|---|
| WO | 2017116446 A1 | 7/2017 |
| WO | 2018058061 A1 | 3/2018 |

OTHER PUBLICATIONS

Damian S. Steiger, "Software and Algorithims for Quantum Computing", Jan. 1, 2018, pp. 1-111, XPO55695781.
Wootters Mary et al., "Lower bounds for quantized matrix completion", 2013 IEEE International Symposium on Inforamtions Theory, IEEE, Jul. 7, 2013, pp. 296-300 XPO32497176.
PCT/EP2020/054513 International Search Report dated May 28, 2020.
PCT/EP2020/054513 Written Opinion dated May 28, 2020.
E. Van Den Berg, "Practical sampling schemes for quantum phase estimation", arxiv.org., Cornell University Library, arXiv:1902.11168v1 [quant-ph] Feb. 28, 2019.
Richard Cleve et al., "Quantum algorithms revisited," in Proceedings of the Royal Society of London A: Mathematical, Physical and Engineering Sciences, vol. 454, No. 1969, pp. 339-354. The Royal Society, 1998.

(Continued)

*Primary Examiner* — Manuel A Rivera Vargas
(74) *Attorney, Agent, or Firm* — Henry J. Daley; Venable LLP

(57) ABSTRACT

A method of determining a quantum phase of quantum device including performing a plurality of measurements for cosine and sine components of the quantum phase; counting a number of measurements in a vertical axis for the sine component and counting a number of measurements in a horizontal axis for the cosine component; and determining the quantum phase based on a majority of a number of 0 measurements and a number of 1 measurements of the sine component and the cosine component.

21 Claims, 7 Drawing Sheets

(56) References Cited

OTHER PUBLICATIONS

Hamed Ahmadi et al., "Quantum phase estimation with arbitrary constant-precision phase shift operators," arXiv preprint arXiv:1012.4727 (2010).
V. Parasa et al., "Quantum Phase Estimation Using Multivalued Logic," 2011 41st IEEE International Symposium on Multiple-Valued Logic, Tuusula, 2011, pp. 224-229.
Krysta M. Svore et al., "Faster Phase estimation," Internet Citation, Apr. 2, 2013 (Apr. 2, 2013), pp. 1-14, XP002736091, Retrieved from the Internet <URL:http://arxiv.org/pdf/ 13 04.0741.pdf>.
E. Van Den Berg, "Practical sampling schemes for quantum phase estimation", Dec. 15, 2018, IBM T.J. Watson, Yorktown Heights, NY, USA.
Kitaev et al., "Classical and Quantum Computation," Graduate Studies in Mathematics, vol. 47, American Mathematical Society (2002).
Dobsicek et al., "Arbitrary accuracy iterative phase estimation algorithm as a two qubit benchmark", arXiv:quant-ph/0610214v3, Jul. 12, 2007.
Chiang, "Selecting Efficient Phase Estimation With Constant-Precision Phase Shift Operators", arXiv:1306.2715v1 [quant-ph] Jun. 12, 2013.

\* cited by examiner

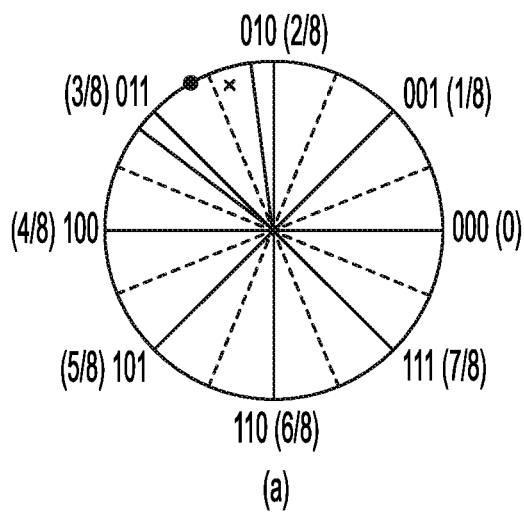
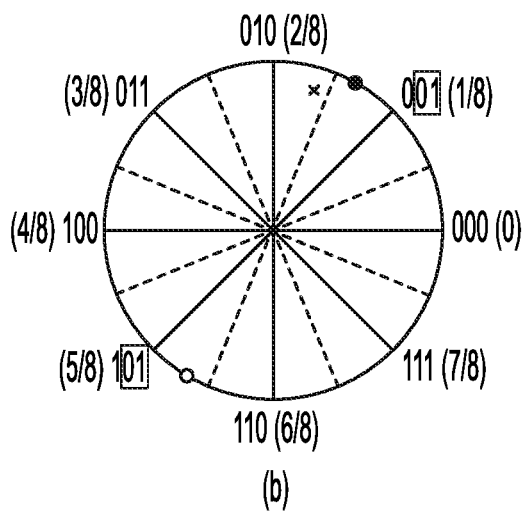
FIG. 3A  FIG. 3B
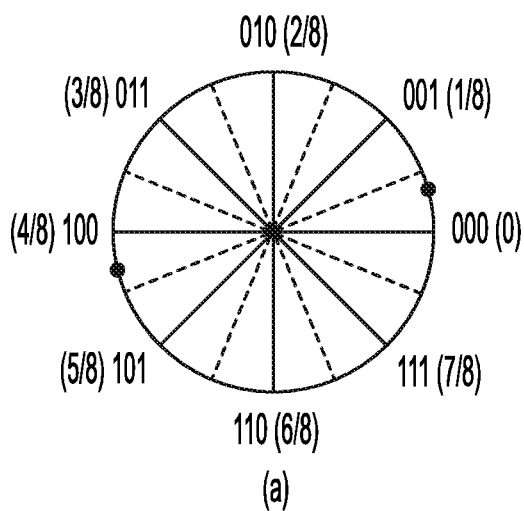
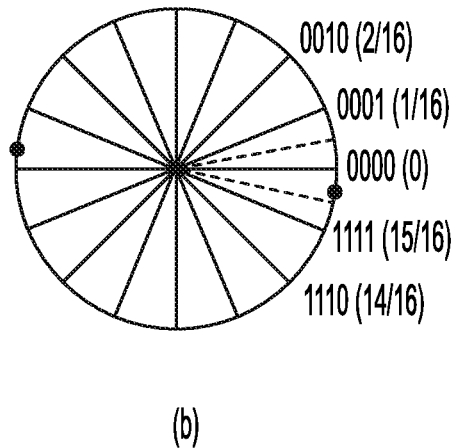
FIG. 4A  FIG. 4B

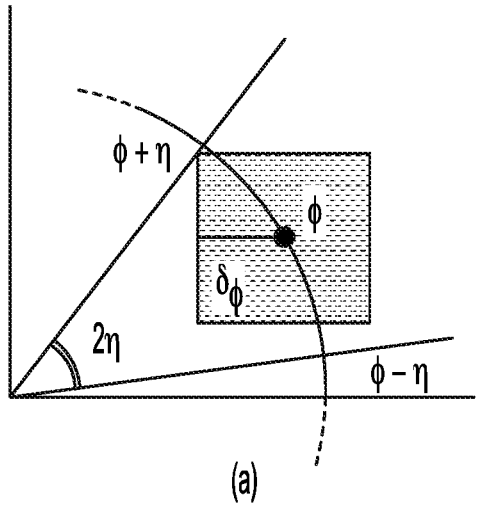
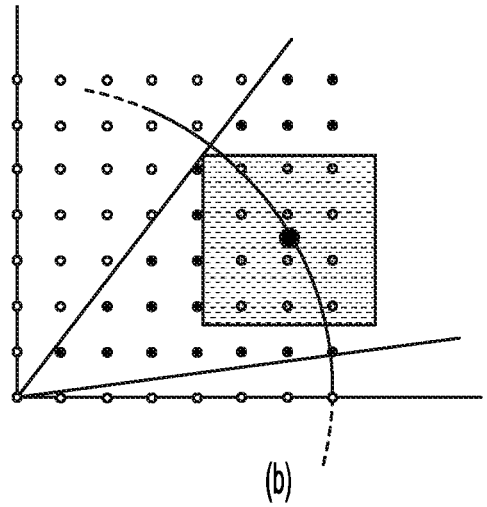
FIG. 5A　　　　　　　　FIG. 5B
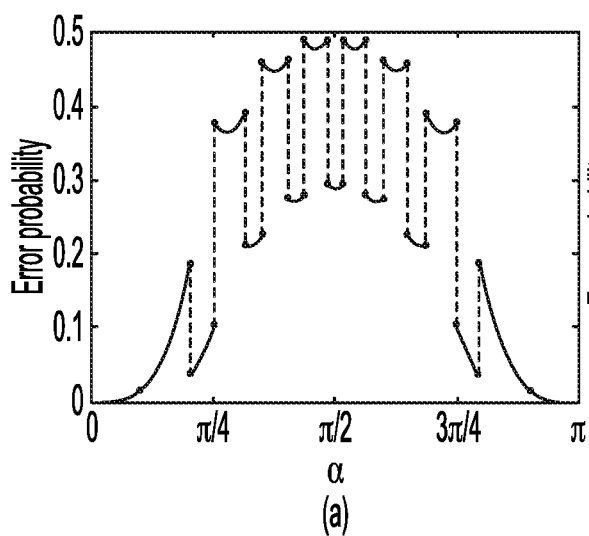
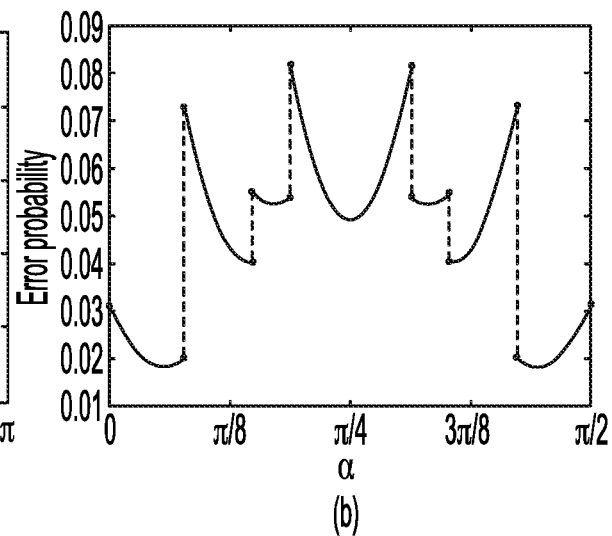
FIG. 6A　　　　　　　　FIG. 6B (a)

(b)

(c)

(d)

METHOD FOR ESTIMATING A QUANTUM PHASE

BACKGROUND

The currently claimed embodiments of the present invention relate to quantum computation, and more specifically, to a method for estimating a quantum phase in a quantum device.

In quantum computations, it is desirable to estimate the quantum phase in order to determine the eigenvalues of a unitary operator operating on a quantum state and thus determine the energy level(s) of the quantum state. The importance of quantum phase estimation is highlighted by the wide range of applications that rely on it, including, for example, Shor's prime factorization algorithm to find the prime factors of a given number, in quantum chemistry to determine molecular energy levels of multi-atomic molecular systems or find the molecular electronic structure of complex molecules (e.g., bio-molecules), and in quantum Metropolis sampling for the simulation of many-body quantum physics in interacting quantum particles (e.g., condensed matter physics, chemistry, and high energy physics).

The two main approaches to quantum phase estimation are the Fourier-based approach and Kitaev's algorithm. For example, Kitaev's algorithm is based on the estimation of the quantum phase by calculating the sine and cosine values of the quantum phase and then using the sine and cosine values to determine the phase using arctangent. However, Kitaev's approach is a lengthy process and requires repeated measurements using a quantum circuit and repeated calculations of the cosine and sine values of the quantum phase to then extract the quantum phase using arctangent. Each measurement involves "adding" another quantum circuit (the quantum circuit having a plurality of gates) to a quantum device. This results in the quantum device having a relatively larger depth due to the requirement of performing many measurements. The term depth in quantum computing is defined as the number of gates or circuit elements on any path from input to output.

SUMMARY

An aspect of the present invention is to provide a method for determining a quantum phase induced by a unitary operator in a quantum device. The method includes providing a plurality of quantum circuits connected in series, wherein an output of a first quantum circuit in the plurality of quantum circuits is an input of a second quantum circuit in the plurality of quantum circuits. The method further includes determining a quantum phase induced by the unitary operator by performing a plurality of measurements of an output of each of the plurality of quantum circuits comprising performing a first measurement in the plurality of measurements of the quantum phase using the first quantum circuit in the plurality of quantum circuits and performing a second measurement in the plurality of measurements of the quantum phase using the second quantum circuit in the plurality of quantum circuits. A number of the plurality of quantum circuits used to determine the quantum phase depends on a number of the plurality of measurements needed to determine the quantum phase within a desired precision, wherein the number of the plurality of measurements is reduced for the desired precision by using a majority sampling method. The majority sampling method includes performing a plurality of measurements for cosine and sine components of the quantum phase; counting a number of measurements in a vertical axis for the sine component and counting a number of measurements in a horizontal axis for the cosine component; and determining the quantum phase based on a majority of a number of 0 measurements and a number of 1 measurements of the sine component and the cosine component.

In an embodiment, determining the phase based on the majority of the number of 0 measurements and the number of 1 measurements of the sine component and the cosine component comprises determining a quantization of the quantum phase $q(n_x, n_y)$ as a function of the number of measurements $(n_y)$ in the vertical axis for the sine component and the number of measurements $(n_x)$ in the horizontal axis for the cosine component.

In an embodiment, the quantization of the quantum phase $q(n_x, n_y)$ is equal to:

$\overline{0.00}$ if $n_x$ is greater than or equal to a maximum of $n_y$ and $n-n_y+1$;

$\overline{0.01}$ if $n_y$ is greater than or equal to a maximum of $n_x+1$ and $n-n_x$;

$\overline{0.10}$ if $n-n_x$ is greater than or equal to a maximum of $n_y+1$ and $n-n_y$; and $\overline{0.11}$ otherwise.

In an embodiment, the performing the first measurement or the second measurement includes applying a first Hadamard gate to a first state of a first qubit to put the first qubit into a superposition of states; applying a phase shift gate to the superposition of states of the first qubit to apply a first phase to the first qubit; applying a unitary operator ($U^s$) gate to a quantum state conditioned on the first qubit to apply a second phase to the quantum state; applying a second Hadamard gate to the first qubit; performing a measurement on the first qubit to determine probability values of measuring an output value of one based on input values of the first phase, the probability value depending on the first phase and the second phase; and determining the second phase based on the probability values.

In an embodiment, determining the second phase comprises selecting a value of the first phase equal to zero radian and $-\frac{1}{4}$ radian and estimating a sine and a cosine of the second phase based on probability values of obtaining an initial second phase at the selected value of the first phase.

In an embodiment, applying the unitary operator ($U^s$) gate to the quantum state comprises applying the second phase multiplied by a factor that is proportional to 2 to the power j−1, wherein the second phase is expressed as a string of binary bits after the binary point and wherein j corresponds to incremental bit positions of binary bit values in the string of binary bits of the second phase.

In an embodiment, the method further includes iteratively adding one bit to the string of binary bits of an initial second phase per step and shifting a previous bit string by one, and repeating applying the first Hadamard gate to the first state of the first qubit; applying the phase shift gate to the superposition of states of the first qubit to apply the first phase to the first qubit; applying the unitary operator ($U^s$) gate to the quantum state conditioned on the first qubit to apply the second phase to the quantum state; applying the second Hadamard gate on the first qubit; performing the measurement on the first qubit to determine the probability values of measuring the output value of one based on the input values of the first phase, the probability value depending on the first phase and the second phase; and determining an updated value of the second phase.

In an embodiment, the method further includes choosing the first phase equal to the updated second phase divided by minus two to obtain an adjusted second phase that is a threshold value away from a horizontal axis; determining a sign of a cosine of the adjusted second phase; and setting a value of a last added binary bit in the string of binary bits of the updated second phase based on the determined sign of the cosine of the adjusted second phase. In an embodiment, if the sign of the cosine of the adjusted second phase is positive, setting the last added binary bit of the string of binary bits of the updated second phase to 0 and if the sign of the cosine of the adjusted second phase is negative, setting the last added binary bit of the string of binary bits of the updated second phase to 1.

In an embodiment, determining the updated value of the second phase comprises determining with a probability equal to at least substantially one a position of the updated second phase based on the sign of the cosine relative to right or left of a vertical axis when the adjusted second phase is at most $\pi/4$ from either 0 or $\pi$, or relative to a horizontal axis when the adjusted second phase is at most $\pi/4$ from either $\pi/2$ or $3\pi/2$, or both.

Another aspect of the present invention is to provide a method of determining a quantum phase of a quantum device. The method includes performing a plurality of measurements for cosine and sine components of the quantum phase; counting a number of measurements in a vertical axis for the sine component and counting a number of measurements in a horizontal axis for the cosine component; and determining the quantum phase based on a majority of a number of 0 measurements and a number of 1 measurements of the sine component and the cosine component.

In an embodiment, determining the phase based on the majority of the number of 0 measurements and the number of 1 measurements of sine component and the cosine component comprises determining a quantization of the quantum phase $q(n_x, n_y)$ as a function of the number of measurements $(n_x)$ in the vertical axis for the sine component and the number of measurements $(n_y)$ in the horizontal axis for the cosine component.

In an embodiment, the quantization of the quantum phase $q(n_x, n_y)$ is equal to:

$\overline{0.00}$ if $n_x$ is greater than or equal to a maximum of $n_y$ and $n-n_y+1$;

$\overline{0.01}$ if $n_y$ is greater than or equal to a maximum of $n_x+1$ and $n-n_x$;

$\overline{0.10}$ if $n-n_x$ is greater than or equal to a maximum of $n_y+1$ and $n-n_y$; and $\overline{0.11}$ otherwise.

In an embodiment, the method further includes iteratively adding one bit to the string of binary bits of an initial second phase per step and shifting a previous bit string by one, and repeating applying the first Hadamard gate to the first state of the first qubit; applying the phase shift gate to the superposition of states of the first qubit to apply the first phase to the first qubit; applying the unitary operator ($U^s$) gate to the quantum state conditioned on the first qubit to apply the second phase to the quantum state; applying the second Hadamard gate on the first qubit; performing the measurement on the first qubit to determine the probability values of measuring the output value of one based on the input values of the first phase, the probability value depending on the first phase and the second phase; and determining an updated value of the second phase.

In an embodiment, the method further includes choosing the first phase equal to the updated second phase divided by minus two to obtain an adjusted second phase that is a threshold value away from a horizontal axis; determining a sign of a cosine of the adjusted second phase; and setting a value of a last added binary bit in the string of binary bits of the updated second phase based on the determined sign of the cosine of the adjusted second phase. In an embodiment, if the sign of the cosine of the adjusted second phase is positive, setting the last added binary bit of the string of binary bits of the updated second phase to 0 and if the sign of the cosine of the adjusted second phase is negative, setting the last added binary bit of the string of binary bits of the updated second phase to 1.

In an embodiment, determining the updated value of the second phase comprises determining with a probability equal to at least substantially one a position of the updated second phase based on the sign of the cosine relative to right or left of a vertical axis when the adjusted second phase is at most $\pi/4$ from either 0 or $\pi$, or relative to a horizontal axis when the adjusted second phase is at most $\pi/4$ from either $\pi/2$ or $3\pi/2$, or both.

Another aspect of the present invention is to provide a quantum device having a plurality of quantum circuits for determining the quantum phase. The quantum device including a plurality of quantum circuits connected in series, wherein an output of a first quantum circuit in the plurality of quantum circuits is an input of a second quantum circuit in the plurality of quantum circuits. The plurality of quantum circuits are configured and arranged to determine a quantum phase induced by a unitary operator in the quantum device by performing a plurality of measurements of an output of each of the plurality of quantum circuits comprising performing a first measurement in the plurality of measurements of the quantum phase using the first quantum circuit in the plurality of quantum circuits and performing a second measurement in the plurality of measurements of the quantum phase using the second quantum circuit in the plurality of quantum circuits. A number of the plurality of quantum circuits used to determine the quantum phase depends on a number of the plurality of measurements needed to determine the quantum phase within a desired precision. The number of the plurality of measurements is reduced for the desired precision by using a majority sampling method including performing a plurality of measurements for cosine and sine components of the quantum phase; counting a number of measurements in a vertical axis for the sine component and counting a number of measurements in a horizontal axis for the cosine component; and determining the phase based on a majority of a number of 0 measurements and a number of 1 measurements of the sine component and the cosine component.

In an embodiment, the first quantum circuit or the second quantum circuit or both includes a first Hadamard gate configured to apply to a first state of a first qubit to put the first qubit into a superposition of states; a phase shift gate configured to apply to the superposition of states of the first qubit a first phase; a unitary operator ($U^s$) gate configured to apply to a quantum state conditioned on the first qubit a second phase; a second Hadamard gate configured to apply a second quantum phase to the first qubit; and a measurement component configured to perform a measurement on the first qubit to determine probability values of measuring an output value of one based on input values of the first phase, the probability value depending on the first phase and the second phase.

One benefit of the present invention is to determine the quantum phase with a reduced or minimized number of measurements so as to reduce the number of quantum circuits (or circuit elements such as gates) and hence reduce or minimize the depth of the quantum device for determining the quantum phase.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

FIG. 3A is a plot showing that the estimation of the angle $\Phi_j$ indicated by the dot that is done by obtaining estimates of the sine and cosine values (indicated by the purple cross), according to an embodiment of the present invention;

FIG. 3B is a plot showing that the estimation of the angle $100_j$ when the last two bits are fixed to the leading two from previous estimates gives points closest to 0<u>01</u>, indicated by the shaded region, or closest to <u>1</u>01 and measuring the cross determines $\beta'_j=0$, according to an embodiment of the present disclosure;

FIGS. 4A and 4B are plots showing an application of a phase shift that ensures that the unknown angle (indicated by the dot) lies within one of the highlighted wedges centered on the horizontal axis, according to an embodiment of the present invention;

FIG. 5A is a plot showing an estimation of angle $\phi$ with accuracy $\eta$, according to an embodiment of the present invention;

FIG. 5B is a plot showing the same estimation as in FIG. 5A based on discrete points during sampling, according to an embodiment of the present invention;

FIGS. 6A and 6B are plots showing the error probability $1-\Pr(K_{n,\delta}(p))$ as a function of angle for $\delta=0.3$, when taking eight measurements, according to embodiments of the present invention;

DETAILED DESCRIPTION

Figure 1:
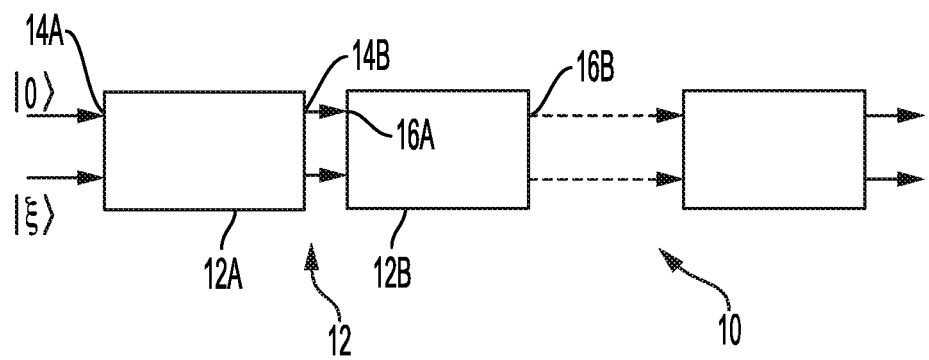
FIG. 1 is a schematic diagram of a quantum device using a plurality of quantum circuits, according to an embodiment of the present invention.

FIG. 1 is a schematic diagram of a quantum device using a plurality of quantum circuits, according to an embodiment of the present invention. As shown in FIG. 1, the quantum device 10 includes a plurality of quantum circuits 12 that are connected in series. The plurality of quantum circuits include a first quantum circuit 12A and a second quantum circuits 12B. The first quantum circuit 12A has an input 14A and an output 14B. The second quantum circuit 12B has an input 16A and an output 16B. An output 14B of the first quantum circuit 12A in the plurality of quantum circuits 12 is connected to an input 16A of the second quantum circuit 12B in the plurality of quantum circuits 12. Although two quantum circuits are discussed herein and shown in FIG. 1, as it can be appreciated, many more quantum circuits can be used as illustrated by the dotted line which indicates that 2 or more quantum circuits can be used as will be explained further in the following paragraphs.

The quantum circuits 12A and 12B include a unitary operator gate that induces a quantum phase $\varphi$ on an input quantum state $|\xi\rangle$ of the respective circuits 12A and 12B. It is desirable to estimate the quantum phase $\varphi$ in order to evaluate the eigenvalue $\lambda$ of the unitary operator U and thus determine the energy level of the input quantum state. The eigenvalue $\lambda$ as a result of the unitarity can be written as $\lambda=e^{i2\pi\varphi}$ with $\varphi$ in the interval [0, 1).

The quantum phase $2\pi\varphi$ induced by the unitary operator can be estimated by performing a plurality of measurements of an output of each of the plurality of quantum circuits. Performing the plurality of measurement on the output of each of the plurality of quantum circuits includes performing a first measurement in the plurality of measurements of the quantum phase $\varphi$ using the first quantum circuit 12A and performing a second measurement in the plurality of measurements of the quantum phase $2\pi\varphi$ using the second quantum circuit 12B. In the present disclosure, although the quantum phase is $2\pi\varphi$, the quantum phase is noted herein throughout as $\varphi$ for reasons of simplicity, however the factor $2\pi$ is implied.

A number of the plurality of quantum circuits 12 used to determine the quantum phase $\varphi$ depends on a number of the plurality of measurements needed to determine the quantum phase $\varphi$ within a desired precision. For example, if two measurements are performed to determine the quantum phase $\varphi$, two quantum circuits 12 (for example quantum circuits 12A and 12B) may be needed to accomplish this task. Similarly, by extension, if N measurements are performed to determine the quantum phase $\varphi$, N quantum circuits 12 may be needed to accomplish this task. In an embodiment, the desired precision can be preset by the user as desired. In an embodiment, the desired precision is set to be at least 2 binary bits after the binary point, for example (.mn, where mn are the binary numbers 0 or 1).

As stated in the above paragraphs, it is desirable to reduce or minimize the number of measurements so as to reduce the number of quantum circuits 12 (or circuit elements such as gates in the quantum circuits 12) and hence reduce or minimize the depth of the quantum device for estimating the quantum phase φ. The minimization of the number of measurements can be achieved by using a majority sampling method. The inventor developed the method of majority sampling to reduce or minimize the number of measurements and hence reduce or minimize the depth of the quantum device, resulting in an overall efficient process in determining or estimating the quantum phase φ.

In an embodiment, the novel majority sampling method includes i) performing the plurality of measurements for cosine and sine components of the quantum phase φ; ii) counting a number of measurements in a vertical axis for the sine component and counting a number of measurements in a horizontal axis for the cosine component; and iii) determining the phase based on a majority of a number of 0 measurements and a number of 1 measurements of the sine component and the cosine component.

In an embodiment, determining the quantum phase φ based on the majority of the number of 0 measurements and the number of 1 measurements of the sine component and the cosine component includes determining a quantization of the quantum phase $q(n_x, n_y)$ as a function of the number of measurements $(n_y)$ in the vertical axis for the sine component and the number of measurements $(n_x)$ in the horizontal axis for the cosine component.

In an embodiment, the quantization of the quantum phase $q(n_x, n_y)$ is equal to:

$\overline{0.00}$ if $n_x$ is greater than or equal to a maximum of $n_y$ and $n-n_y+1$;

$\overline{0.01}$ if $n_y$ is greater than or equal to a maximum of $n_x+1$ and $n-n_x$;

$\overline{0.10}$ if $n-n_x$ is greater than or equal to a maximum of $n_y+1$ and $n-n_y$; and $\overline{0.11}$ otherwise. The "." corresponds to the binary period.

It is noted that, according to an aspect of the present invention, the majority sampling method does not calculate the quantum phase itself, i.e., does not calculate the quantum phase by dividing the sine and cosine and then extracting the phase using arctangent. The majority sampling is more efficient as it does not perform this calculation. Instead the quantum phase is determined or estimated in discrete form (in binary form) using the quantization method by counting a number of measurements in a vertical axis for the sine component and counting a number of measurements in a horizontal axis for the cosine component and then determining the phase based on a majority of a number of 0 measurements and a number of 1 measurements of the sine component and the cosine component. The majority sampling method will be explained in further detail in the following paragraphs.

In FIG. 1, the quantum device 10 includes the plurality of quantum circuits 12. Each quantum circuit 12 (including the first quantum circuit 12A and the second quantum circuit 12B) comprises a plurality of circuit elements such as quantum gates, quantum operator, etc.

Figure 2:
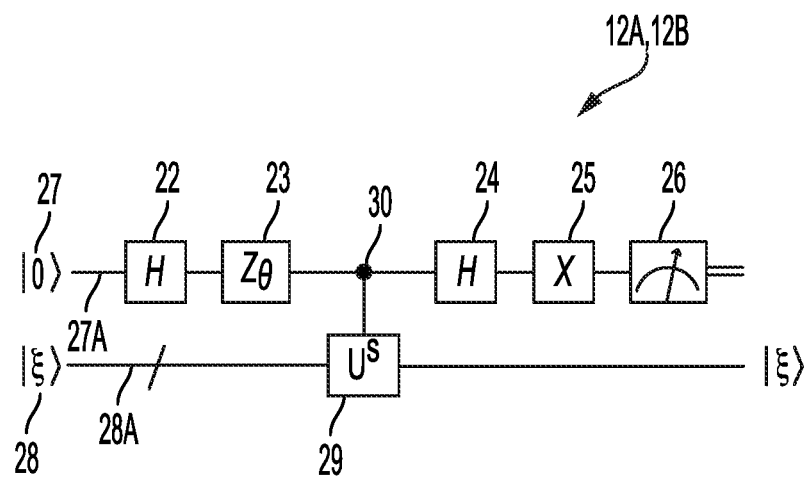
FIG. 2 is a schematic diagram of a first quantum circuit or a second quantum circuit in the quantum device, according to an embodiment of the present invention.

FIG. 2 is a schematic diagram of the first quantum circuit or the second quantum circuit, according to an embodiment of the present invention. The first quantum circuit 12A or the second quantum circuit 12B comprises a first Hadamard (H) gate 22. The first Hadamard gate 22 is connected to phase shift gate ($Z_θ$) 23. The phase shift gate 23 is connected to a second Hadamard (H) gate 24. The second Hadamard gate 24 is connected to NOT gate or X gate 25 connected to measurement component 26. Although the NOT gate or X gate 25 is shown used in the quantum circuits 12A, 12B, the NOT gate 25 is optional and is simply used to change the quantum bit from |1> to |0> and vice versa. In an embodiment, a second NOT gate (not shown), similar to NOT gate 25, can also be used to prepare the quantum state for the next quantum circuit (e.g., the second quantum circuit 12B), when measuring a |1>. The second NOT gate is connected to measurement component 26. In an embodiment, the second NOT gate is applied after the measurement 26 (after measuring a |1>) to change the qubit |1> to qubit |0> before inputting the qubit |0> into the next quantum circuit (e.g., the second quantum circuit 12B).

A first qubit 27 (for example, |0> as shown in FIG. 2) is input to the first quantum circuit 12A or the second quantum circuit 12B through a first input line 27A via the first Hadamard gate 22. A quantum state |ξ>28 is also input to the first quantum circuit 12A or the second quantum circuit 12B through a second line 28A. In an embodiment, the second line 28A is connected to unitary operator ($U^s$) 29. In an embodiment, the unitary operator ($U^s$) 29 is connected at point 30 to a line between the phase shift gate ($Z_θ$) 23 and the second Hadamard gate 24. In another embodiment, the unitary operator ($U^s$) 29 can instead be connected to a line between the first Hadamard gate 22 and the phase shift gate ($Z_θ$) 23.

In operation, a procedure is applied to determine or estimate the quantum phase φ. In the procedure, the first Hadamard gate 22 is applied to the first state of the first qubit 27 to put the first qubit 27 into a superposition of states. The phase shift gate 23 is then applied to the superposition of states of the first qubit 27 to apply a first phase θ to the first qubit 27. In an embodiment, the first phase θ is applied on the |1> component of the superposition of states. The unitary operator ($U^s$) gate 29 is applied to the quantum state |ξ>28 conditioned on the first qubit 27 to apply a second phase φ to the quantum state |ξ>28. A second Hadamard gate 24 is applied to the first qubit 27. The output of the second Hadamard gate 24 can be optionally reversed using NOT gate 25. A measurement is then performed on the first qubit 27 using measurement component 26 to determine probability values of measuring an output value of one (1) based on input values of the first phase θ. The probability value depends on the first phase θ and the second phase φ. Finally, the second phase φ is determined based on the probability values. As it must be understood, the second phase φ corresponds to the quantum phase induced by the unitary operator in the quantum device 10. The term "second" for the quantum phase φ is used here to differentiate from the "first" phase θ applied by the phase shift gate ($Z_θ$) 23. However, this does not imply the order in which the first phase θ and the second phase φ are applied as the second phase φ can be applied before the first phase θ or vice versa.

In an embodiment, determining the second phase φ includes selecting a value of the first phase θ equal to zero radian and -¼ radian and estimating a sine and a cosine of the second phase φ based on probability values of obtaining an initial second phase at the selected value of the first phase θ. In an embodiment, applying the unitary operator ($U^s$) gate 29 to the quantum state 28 includes applying the second phase φ multiplied by a factor that is proportional to 2 to the power "j-1." As it will be explained in further detail below, the second phase φ is expressed as a string of binary bits after the binary point. "j" corresponds to incremental bit positions of binary bit values in the string of binary bits of the second phase φ. For example, the quantum phase (i.e., the second phase) φ can be expressed as a string of binary numbers after the binary period as follows: ".$β_1β_2β_3 \ldots β_n$".

In an embodiment, the procedure further includes iteratively adding one bit to the string of binary bits ".$β'_m$ $\beta'_{m+1}\beta'_{m+2}$" of an initial second phase per step and shifting a previous bit string by one, and repeating applying the first Hadamard gate 22 to the first state of the first qubit; applying the phase shift gate 23 to the superposition of states of the first qubit to apply the first phase to the first qubit; applying the unitary operator ($U^s$) gate to the quantum state conditioned on the first qubit to apply the second phase to the quantum state; applying the second Hadamard gate 24 on the first qubit; performing the measurement using measured component 26 on the first qubit to determine the probability values of measuring the output value of one based on the input values of the first phase, the probability value depending on the first phase and the second phase; and determining an updated value of the second phase. The above "repeating" means that initially the measurement is performed using the first circuit 12A, then the measurement is repeated by using the second quantum circuit 12B, a third circuit, etc. . . . , until the second phase φ is estimated with the desired precision. In an embodiment, before repeating the measurement using a next quantum circuit (e.g., second quantum circuit 12B), a second NOT gate 25 can be applied to the output of a previous quantum circuit (e.g., first quantum circuit 12A), if the output of the previous quantum circuit (e.g., first quantum circuit 12A) is |1>, to initialize the input of the next quantum circuit (e.g., second quantum circuit 12B) to |0>.

In an embodiment, the procedure further includes choosing the first phase equal to the updated second phase divided by minus two (i.e., choosing $\theta=-\varphi_{j+1}/2$) to obtain an adjusted second phase that is a threshold value away from a horizontal axis; determining a sign of a cosine of the adjusted second phase; and setting a value of a last added binary bit in the string of binary bits of the updated second phase based on the determined sign of the cosine of the adjusted second phase.

In an embodiment, if the sign of the cosine of the adjusted second phase is positive, setting the last added binary bit of the string of binary bits of the updated second phase to 0 and if the sign of the cosine of the adjusted second phase is negative, setting the last added binary bit of the string of binary bits of the updated second phase to 1.

In an embodiment, determining the updated value of the second phase includes determining with a probability equal to at least substantially one a position of the updated second phase based on the sign of the cosine relative to right or left of a vertical axis when the adjusted second phase is at most $\pi/4$ from either 0 or $\pi$, or relative to a horizontal axis when the adjusted second phase is at most $\pi/4$ from either $\pi/2$ or $3\pi/2$, or both. The term "a probability equal to at least substantially one" means that the probability is equal to $(1-\epsilon)$, where $\epsilon$ is a relatively small positive number less than $10^{-1}$, i.e., $\epsilon$ is between 0 and $10^{-1}$.

In the following paragraphs, various features of the quantum device and the above method for estimating the quantum phase φ will be described in greater detail with the support of mathematical equations, statements and their verifications. One of ordinary skill in the art when reading the following paragraphs would appreciate the extent to which the inventor has developed in great detail the method of determining the quantum phase. It will become clear in the following paragraphs that the method described herein finds support throughout the detailed description of each of the above features.

As illustrated in the quantum circuit 12A, 12B shown in FIG. 2, initially, assuming an initial state of $|0\rangle|\xi\rangle$, the circuit first applies a first Hadamard operation using the first Hadamard gate 22 on the first qubit, followed by a phase-shift operation using the phase shift operator $Z_\theta$ gate 23.

$$Z_\theta = \begin{bmatrix} 1 & 0 \\ 0 & e^{i2\pi\theta} \end{bmatrix}.$$

The circuit then applies the unitary operator gate $U^s$ 29 on the $|\xi\rangle$ 28 quantum state, conditioned on the first qubit 27, where $$U^s|\xi\rangle = \lambda^s|\xi\rangle = e^{i2\pi(s\varphi)}|\xi\rangle. \quad (1)$$

Finally, a second Hadamard operation using the second Hadamard gate 24 is applied on the first qubit followed by the application of NOT gate 25 (if needed) and the measurement with measurement component 26. It is noted that the NOT gate is inserted only to simplify exposition, as it allows the inventor to focus on measurements with value 1 instead of 0, which will be more natural. In practice, the measurements could be negated. In addition, as explained in the above paragraphs, another NOT gate can also be used after the measurement of output of a previous quantum circuit (e.g., first quantum circuit 12A) to ensure that a subsequent circuit (e.g., second quantum circuit 12B) has an input qubit set to |0>. All algorithms provided herein apply equivalently to non-negated measurements. The circuit performs the following mapping:

$$|0\rangle \otimes |\xi\rangle \to \left(\frac{1-e^{i2\pi(s\varphi+\theta)}}{2}|0\rangle + \frac{1+e^{i2\pi(s\varphi+\theta)}}{2}|1\rangle\right) \otimes |\xi\rangle$$

Measuring the first qubit therefore returns 1 with probability $$P_\theta(1|\varphi) = \left|\frac{1+e^{i2\pi(\varphi+\theta)}}{2}\right|^2 = \frac{1+\cos(2\pi(\varphi+\theta))}{2},$$

and 0 otherwise. By appropriately choosing θ we can obtain information on the sine and cosine of φ, since $$\cos(2\pi\varphi)=2P_0(1|\varphi)-1, \text{ and } \sin(2\pi\varphi)=2P_{-1/4}(1|\varphi)-1. \quad (2)$$

Repeated measurements of the quantum circuit with $\theta=0$ and $\theta=-\frac{1}{4}$ allow us to approximate $P_0$ and $P_{-1/4}$, from which the sine and cosine values and subsequently φ can then be determined. Throughout this specification we use the convention that angles φ, θ, and ω are expressed in radians divided by $2\pi$, whereas angles a are always expressed in radians. We frequently use $$p_x(\alpha) = \frac{1+\cos(\alpha)}{2}, \text{ and } p_y(\alpha) = \frac{1+\sin(\alpha)}{2},$$

and write $p_x$ and $p_y$ when the dependency on a is clear (with $\alpha=2\pi\varphi$).

Kitaev's algorithm: The goal in Kitaev's algorithm is to obtain the approximation $$\tilde{\varphi} = .\overline{\beta'_1 \beta'_2 \cdots \beta'_m \beta'_{m+1} \beta'_{m+2}} = \sum_{j=1}^{m+2} 2^{-j}\beta'_j$$

for $\varphi = .\overline{\beta_1\beta_2\beta_3...}$, such that $|\varphi - \tilde{\varphi}| \le 2^{-(m+2)}$ holds with probability at least $1-\epsilon$. The key principle behind the algorithm lies in the fact that using $U^s$ in (1) with $s=2^{j-1}$ gives measurements about $s\varphi$, and therefore amounts to shifting the bits in $\varphi$ to the left by $j-1$ positions:

$$\varphi_j := 2^{j-1}\varphi = .\overline{\beta_j\beta_{j+1}\beta_{j+2}...} \mod 1.$$

The multiplicative factor of a causes the phase to be invariant to the integer part $\overline{\beta_1...\beta_{j-1}}$ which can therefore be omitted. As a result, by choosing j we can work with the bitstring starting from any $\beta_j$. Using this, the first step of Kitaev's algorithm is to choose j=m and estimate $\tilde{\varphi}_j = .\overline{\beta'_m\beta'_{m+1}\beta'_{m+2}}$ such that $|\varphi_j - \tilde{\varphi}_j| \leq 1/8$ with probability at least $1-\overline{\in}_m$. This is done by taking sufficiently many samples (as will be discussed in detail in the following paragraphs) to estimate $\cos(2\pi\varphi_j)$ and $\sin(2\pi\varphi_j)$ such that the approximated angle $\omega_j$ deviates from $\varphi_j$ by at most $1/16$ with probability at least $1-\overline{\in}_m$. The angle $\omega_j$ is then quantized (rounded) to the nearest integer multiple of $1/8$ modulo 1 to obtain $\tilde{\varphi}_j$. With a maximum quantization error of $1/16$, this amounts to an accuracy of at least $1/8$.

FIG. 3A is a plot showing that the estimation of the angle $\varphi_j$ indicated by the dot is done by obtaining estimates of the sine and cosine values (indicated by the purple cross), from which an approximate angle $\omega_j$ and quantization (010) can be obtained, according to an embodiment of the present invention.

FIG. 3B is a plot showing that the estimation of the angle $\varphi_j$ when the last two bits are fixed to the leading two from previous estimates gives points closest to 001, indicated by the shaded region, or closest to 101 and measuring the cross determines $\beta'_j=0$, according to an embodiment of the present disclosure. The angle $\varphi_{j+1}$ is equal to $2\varphi_j$ modulo 1, and can therefore originate from either of the dots in the plot shown in FIG. 3B.

According to an embodiment of the present invention, a second stage of the algorithm iteratively adds one new bit $\beta'_j$ per step, for j=m−1, . . . , 1. For each step we first obtain a $1/16$ accurate approximation $\omega_j$ of $\varphi_j$ with probability at least $1-\overline{\in}_j$ using the technique outlined above. Next, we enforce consistency using the bitstring known so far and set $$\beta'_j := \begin{cases} 0 & \text{if } |.\overline{0\beta'_{j+1}\beta'_{j+2}} - \omega_j| < 1/4, \\ 1 & \text{if } |.\overline{1\beta'_{j+1}\beta'_{j+2}} - \omega_j| < 1/4. \end{cases}$$

Using a union bound on the error probabilities, it can be seen that the algorithm succeeds with probability at least $1-\Sigma_{j=1}^m \overline{\in}_j$. Choosing $\overline{\in}_j = \overline{\in}/m$ we can therefore ensure with probability at least $1-\overline{\in}$ that all approximate angles $\omega_j$ are valid, in which case $\varphi$ will be $2^{-(m+2)}$ accurate. A graphical illustration of an implementation of Kitaev's algorithm according to an embodiment of the present invention is given in FIGS. 3A and 3B.

The estimation of the sine or cosine terms in equation (2) with accuracy $\delta$ needs an estimation of the probability terms to accuracy $\delta/2$. Let $s_1, \ldots, s_n$, be i.i.d. samples of a Bernoulli distribution with probability of success $p=1-P_\theta$ (1). Denoting $\tilde{p}_n = (1/n) \Sigma_{i=1}^n s_i$, then it follows from the Chernoff bound that $$Pr[|p - \tilde{p}_n| \geq \delta/2] \leq 2e^{-\delta^2 n/2}.$$

We require that the probability $2e^{-\delta^2 n/2}$ be bounded by $\overline{\in}$, which is guaranteed for $$n \geq n(\delta, \epsilon) = \frac{2}{\delta^2} \log(2/\epsilon).$$

For the theoretical complexity of Kitaev's algorithm, we note that m angle estimations $\omega_j$ are used, each requiring approximate sine and cosine values, therefore yielding a total of 2m estimations. By choosing $\overline{\in} = \in/2m$, we obtain an overall sample complexity of $$\frac{4m}{\delta^2} \log(4m/\epsilon) = \vartheta(m \log(m/\epsilon)).$$

Implementations using phase shifts: FIGS. 4A and 4B are plots showing an application of a phase shift that ensures that the unknown angle (indicated by the dot) lies within one of the highlighted wedges centered on the horizontal axis, according to an embodiment of the present invention. The more accurate the reference angle, the smaller the wedge, as shown in FIG. 4A with maximum deviation $1/8$, and as shown in FIG. 4B with a maximum deviation $1/16$.

As a practical implementation to steps in the second stage of Kitaev's algorithm, we consider the situation shown in FIG. 3B. The exact value of $\varphi_j$ is equal to either $(0+\tilde{\varphi}_{j+1})/2$, or $(1+\tilde{\varphi}_{j+1})/2$, as indicated by the dots. Using the first two bits of the binary representation for $\tilde{\varphi}_{j+1}$, in this case 01, we therefore know that $\varphi_j$ is at most $1/8$ away from either 001 or 101. Using this information, we can first rotate $\varphi_j$ by the reference angle, in this case 001, to obtain a new angle that is $1/8$ away from either 000 or 100, as illustrated in FIG. 4A.

Now, instead of approximating both sine and cosine we only need to determine the sign of the cosine, which requires far fewer measurements. We then set $\beta'_j$ based on the sign: if it is positive we set $\beta'_j = 0$, otherwise we set $\beta'_j = 1$. We can further improve this scheme by maintaining all known bits and rotate by 0010, instead of by the truncated version 001. Doing so we obtain an angle that is now at most $1/16$ away from 0 or $1/2$, as shown in FIG. 4B. By using the full binary string $\tilde{\varphi}_{j+1}/2$ at each stage, we get increasingly small deviations from 0 or $1/2$, which increases the magnitude of the cosine value and reduces the number of measurements needed to accurately determine the correct sign.

Increasingly accurate rotations: Here we analyze the measurement complexity in detail. Given that the bits $\beta'_j$ are determined in reverse order (that is, from least to most significant), we switch to working with iterations, such that iteration $k \in [1, m]$ determines $\beta'_{m+1-k}$. We now consider iterations $k \geq 2$, which comprise the second stage of the algorithm. At each iteration in the second stage we need to determine the sign of the cosine of the shifted angle.

In terms of measurements, this amounts to sampling a majority of either zeros or ones. For the number of measurements we have the following result. For example, if we let $\alpha \in (0, \pi/2)$. Then we can correctly distinguish angles from the sets $[-\alpha, \alpha]$ and $[\pi-\alpha, \pi+\alpha]$ with probability at least $1-\varepsilon$ by checking whether the majority of n measurements is 1 or 0, whenever $$n \geq \frac{\log(1/\epsilon)}{\log(1/\sin(\alpha))}. \tag{5}$$

The above can be verified by assuming that an unknown angle lies in the range $[-\alpha, \alpha]$ and denote by $p=(1+\cos(\alpha))/2$. The probability that at most k out of n measurements are 1, with $k < np$ is bounded by [2]:

$$Pr(X \leq k) \leq \exp(-nD(k/n\|p)), \tag{6}$$

where $D(\alpha\|p)$ denotes the relative entropy $$D(a\|p) = a \log\left(\frac{a}{p}\right) + (1-a) \log\left(\frac{1-a}{1-p}\right)$$

We want the majority of the measurements to be 1 and an error therefore occurs whenever $k \leq n/2$. Choosing $k=n/2$, which is allowed since $p > \frac{1}{2}$, gives $\alpha = \frac{1}{2}$ and an error $\in'$ bounded by $$\epsilon' \leq \exp\left(-\frac{n}{2} \log(1/(4p(1-p)))\right) \quad (7)$$

To simplify, we note that $$4p(1-p) = 4\left(\frac{1+\cos(\alpha)}{2}\right)\left(\frac{1-\cos(\alpha)}{2}\right) = 1 - \cos^2(\alpha) = \sin^2(\alpha) \quad (8)$$

We want to ensure that the right-hand side of (7) is less than or equal to $\in$. Taking logarithms and simplification then gives the desired result. The result for $[\pi-\alpha, \pi+\alpha]$ follows similarly.

At iteration k we apply a phase shift based on the angle from the previous iteration, and the statement above with respect to equation (5) therefore applies with a equal to $\alpha_k = \pi/2^{k+1}$ (as an example, at iteration k=2 we have a maximum deviation of $\frac{1}{16}$ or $\pi/8$). When taking a single measurement, the probability of failure is $1-p_k$ where $p_k = p_x(\alpha_k)$. In the special case where k is such that $1-p_k \leq \overline{\in}$, it is therefore follows that only a single sample is needed. It holds that $$1 - p_k = (1 - \cos(\pi/2^{k+1}))/2 \quad (9)$$
$$= \sin^2(\pi/2^{k+2})$$
$$\leq \pi^2/2^{2(k+2)},$$

where we use the identity $1-\cos(x)=2\sin^2(x/2)$ in the second line and $\sin(x) \leq x$ for $x \geq 0$ in the last. We want to find the value of k such that iterations k through m each require only a single measurement and have a combined error bounded by $\overline{\in}$. Choosing $\overline{\in} = \in/k$, gives the requirement $$\sum_{j=k}^{m}(1-p_j) \leq \epsilon/k$$

Bounding the left-hand side as $$\sum_{j=k}^{m}(1-p_j) \sum_{j=k}^{m} \pi^2/2^{2(j+2)} \leq \pi^2 \sum_{j=k}^{\infty}(1/4)^{j+2} = \frac{4\pi^2}{3}\left(\frac{1}{4}\right)^{k+2} = \frac{\pi^2}{12}4^{-k} \quad (10)$$

we obtain the sufficient condition $$4^{-k} \leq \frac{12 \in}{k\pi^2} \quad (11)$$

Taking base-two logarithm and rearranging gives $$2k - \log_2(k/12) \geq \log_2(\pi^2/\in).$$

It can be verified that $\log2(k/12) < k/22$ for $k \geq 0$, and we can therefore choose $$k \geq k_\in := \left\lceil \frac{22}{43}\log_2(\pi^2/\epsilon) \right\rceil \quad (12)$$

The value of $k_\in$ does not depend on m and satisfies that for $k_\in \geq 2$ for all $\in \in (0, 1]$. The bound on the sum of errors for iterations $k \geq k_\in$ in (10) can be seen to apply for any m. We denote by $N_\in$ the total number of measurements taken in the first $k_\in - 1$ iterations, each with an error not exceeding $\overline{\in}$. When $m < k_\in$ it is clear that at most $N_\in$ samples are needed. When $m \geq k_\in$ we need to take an additional sample for each of the remaining $m - k_\in + 1$ steps. The overall sampling complexity is therefore bounded by $N_\in + m$, where $N_\in$ depends only on $\in$ and the sampling methods used for the first $k_\in - 1$ iterations.

Practical sampling schemes: We consider different sampling schemes and study the number of samples needed to attain a desired accuracy with a given error rate. For the evaluation of the error rate, we consider the measurements as a Binomial random variable by counting the number of successful measurements (which could be either 0 or 1, depending on the context). In order to determine the angle to a certain accuracy using n measurements, the number of successful measurements X typically needs to fall in some set $K \subseteq g [n]$, where [n] denotes the set $\{0, 1, \ldots, n\}$. For $p=p_x(\alpha)$ this is satisfied with probability $$Pr(K|n, \alpha) = \sum_{k \in K}\binom{n}{k}p^k(1-p)^{n-k} \quad (13)$$

We also require two-dimensional settings with probabilities $p_x$ and $p_y$, and $K \in [n] \times [n]$, given by $$Pr(K|n, a) = \sum_{(k_x,k_y) \in K}\binom{n}{k_x}\binom{n}{k_y}p_x^{k_x}(1-p_x)^{n-k_x}p_y^{k_y}(1-p_y)^{n-k_y}. \quad (14)$$

The error rate is then given by $1-Pr(K)$, and the goal is to find the minimum n for which the error is below some threshold $\overline{\in}$. In addition to providing bounds, we use the GNU multi-precision arithmetic library (which can be found in the web at gmplib.org) to evaluate the probabilities in equation (13) and equation (14) numerically, thus allowing us to find the exact minimum number of samples needed to attain the desired error level for each of the methods. The best sampling schemes are then used to obtain numerical values for $N_\in$.

Box-based sine and cosine: The first sampling method we look at is the box-based scheme illustrated in FIG. 5A and FIG. 5B. FIG. 5A is a plot showing an estimation of angle φ with accuracy η, according to an embodiment of the present invention. The situation in FIG. 5A is guaranteed when the sine and cosine terms are each estimated with precision $\delta_\varphi$, where the subscript denotes the dependence on φ. FIG. 5B is a plot showing the same estimation as in FIG. 5A based on discrete points during sampling, according to an embodiment of the present invention. In this case however using 14 samples each for sine and cosine (remaining three orthants omitted). The idea is to independently estimate cos (2πφ) and sin (2πφ) to an accuracy η, such that the recovered angle differs no more than η (in radians) from the actual angle, with probability at least 1−∈.

The following statement gives the maximum deviation δ(η) allowed in the sine and cosine estimates to reach the desired accuracy in the angle (a verification of this statement is given in the following paragraphs). For any 0≤η≤π/2 we can compute an estimate $\tilde{\varphi}$ of any φ ∈ [0,2π] with accuracy $|\tilde{\varphi}-\varphi|\leq\eta$ from sine and cosine estimates $\tilde{c}$ and $\tilde{s}$ with $|\tilde{c}-\cos(\varphi)|\leq\delta$ and $|\tilde{s}-\sin(\varphi)|\leq\delta$, whenever $$\delta \leq \delta(\eta) = \frac{\sin(\eta)}{\sqrt{2}} \tag{15}$$

For uniform estimation over φ this bound is tight.

Estimating the cosine is equivalent to estimating the probability p=(1+cos(2πφ))/2 with accuracy δ(η)/2. When taking n measurements we can estimate the probability as k/n, where k is the number of measurements that are 1. The success set $K_{n,\delta}(p)$ is therefore defined as $$K_{n,\delta}(p):=\{k \in [n] | (p-\delta/2)n \leq k \leq (p+\delta/2)n\}, \tag{16}$$

from which we can then evaluate $Pr(K_{n,\delta}(p))$. One difficulty here is that the probability p depends on the unknown angle 2πφ and we therefore need to consider the error rate for all possible angles.

FIGS. 6A and 6B are plots showing the error probability $1-Pr(K_{n,\delta}(p))$ as a function of angle for δ=0.3, when taking eight measurements, according to embodiments of the present invention. FIG. 6A is a plot of the error probability for estimating cosine for different angles for n=8 using a bounding box with δ=0.3. FIG. 6B is a plot showing the error probability for sampling different angles using the wedge-based approach with n=5 and η=π/4.

Due to the discrete nature of the samples there are numerous discontinuities, which are best explained using FIG. 5B, we consider the box centered around a point on the circle at a given angle. For the cosine we only need to consider the horizontal component and it may therefore help to think of a projection of the box onto the horizontal axis. Given an angle and corresponding probability p, the set $K_{n,p}$ then consists of all the points on the horizontal axis within the projected box. As the angle increases, the box shifts, thereby gradually adding and removing points from the set K at critical angles. When looking at the limit as the angle approaches a critical angle, we can take p to be the probability associated with the critical angle. It then follows from equation (13) that the probability of success increases when a point is added to the set, and decreases when a point is removed, and vice versa for the error rate. Indeed, these discontinuities are clearly seen in the error rate plotted in FIG. 6A.

The following statement, which can be verified in the following paragraphs shows that for sufficiently large n, the error curve is piecewise convex in p: If we choose δ>0 and let $f_n(p)=1-Pr(X \in K_{n,\delta}(p))$. Then for n≥max $\{1+1/\delta^2, 3\}$, $f_n(p)$ is piecewise convex on [0, 1] with breakpoints at [0,1] ∩ $\{(k/n)\pm\delta/2\}_{k\in[n]}$.

In order to find the maximum error it therefore suffices to evaluate the error function at the critical angles with boundary points removed from $K_{n,\delta}$. We note that the lower bound on n is a sufficient condition, and FIG. 6A indicates that the condition on n may be improved or eliminated.

Multi-stage evaluation: Instead of attempting to determine the angle in a single pass, we can also apply the general idea behind Kitaev's algorithm and use a multi-level approach. For a two-level approach, we start with a ¼-accurate estimate for 2φ using ⅛ accurate angle estimation followed by two-bit quantization $.\overline{\beta'_1\beta'_2}$. Based on this, we know that $.\overline{0\beta'_1\beta'_2}$ or $.\overline{1\beta'_1\beta'_2}$ is a ⅛ accurate approximation for φ and therefore only need to determine the leading bit, which is conveniently done using the phase-shift technique described in the above paragraphs. Even though we quantize the estimation of 2φ to two bits, we can decide how accurately we want to represent the unquantized estimation, obtained based on the sine and cosine estimates, for use in the phase shift. Using k≥2 bits gives a maximum deviation of ⅛+½$^{k+1}$, which, after halving, gives an angle π/8+π/2$^{k+1}$ for the determination of the sign of the cosine. As shown in Table 1, the smaller the angle the fewer measurements are needed to attain a desired confidence level.

TABLE 1

| Angle | ∈ | | | | | | | | | |
|---|---|---|---|---|---|---|---|---|---|---|
| | $10^{-1}$ | $10^{-2}$ | $10^{-3}$ | $10^{-4}$ | $10^{-5}$ | $10^{-6}$ | $10^{-7}$ | $10^{-8}$ | $10^{-9}$ | $10^{-10}$ |
| 7π/16 | 43 | 139 | 247 | 357 | 469 | 583 | 697 | 813 | 927 | 1043 |
| 6π/16 | 11 | 35 | 61 | 87 | 115 | 143 | 171 | 199 | 227 | 257 |
| 5π/16 | 5 | 15 | 27 | 37 | 49 | 61 | 73 | 85 | 97 | 111 |
| 4π/16 | 3 | 9 | 15 | 21 | 27 | 33 | 39 | 45 | 53 | 59 |
| 3π/16 | 1 | 5 | 9 | 13 | 15 | 19 | 23 | 27 | 31 | 35 |
| 2π/16 | 1 | 3 | 5 | 7 | 9 | 13 | 15 | 17 | 19 | 21 |
| π/16 | 1 | 1 | 3 | 5 | 5 | 7 | 9 | 9 | 11 | 13 |
| π/32 | 1 | 1 | 3 | 3 | 5 | 5 | 7 | 7 | 9 | 9 |
| π/64 | 1 | 1 | 1 | 3 | 3 | 5 | 5 | 5 | 7 | 7 |
| π/128 | 1 | 1 | 1 | 3 | 3 | 3 | 3 | 5 | 5 | 5 |
| π/256 | 1 | 1 | 1 | 1 | 3 | 3 | 3 | 3 | 5 | 5 |

Table 1 provides the number of measurement needed to correctly determine the sign of cos(α) with probability at least 1−∈, when α deviates from 0 or π by at most the given angle.

For a three-stage approach we estimate the unquantized angle 4φ with accuracy ¼, and then quantize to a single bit. We then apply two stages of sign determination using a phase shift based on the unquantized angle or a k-bit discretization to obtain the final ⅛ accurate three-bit quantized estimate for φ.

Numerical evaluation: We numerically evaluate the different box-based schemes and summarize the number of measurements for different error rates $\in$ in Table 2.

TABLE 2

| Description | $\epsilon$ | | | | | | | | | |
|---|---|---|---|---|---|---|---|---|---|---|
| | $10^{-1}$ | $10^{-2}$ | $10^{-3}$ | $10^{-4}$ | $10^{-5}$ | $10^{-6}$ | $10^{-7}$ | $10^{-8}$ | $10^{-9}$ | $10^{-10}$ |
| Single-stage box | 112 | 222 | 334 | 452 | 570 | 688 | 806 | 932 | 1050 | 1176 |
| Two-stage box (2-bits) | 45 | 83 | 121 | 159 | 201 | 241 | 283 | 325 | 365 | 407 |
| Two-stage box (3-bits) | 43 | 79 | 115 | 149 | 189 | 225 | 265 | 305 | 343 | 383 |
| Two-stage box (exact) | 43 | 77 | 111 | 145 | 183 | 217 | 255 | 293 | 331 | 369 |
| Three-stage box (2-bits) | 52 | 96 | 142 | 190 | 240 | 286 | 336 | 386 | 434 | 484 |
| Three-stage box (3-bits) | 38 | 64 | 96 | 126 | 160 | 190 | 224 | 256 | 288 | 320 |
| Three-stage box (exact) | 32 | 54 | 78 | 104 | 130 | 154 | 180 | 208 | 234 | 260 |
| Single-stage box, jointly | 82 | 186 | 296 | 414 | 534 | 652 | 778 | 896 | 1014 | 1140 |
| Single-stage wedge | 40 | 84 | 132 | 188 | 244 | 300 | 358 | 416 | 476 | 534 |
| Two-stage wedge (2-bit) | 19 | 37 | 57 | 77 | 99 | 119 | 141 | 163 | 185 | 207 |
| Two-stage wedge (3-bit) | 17 | 33 | 49 | 67 | 87 | 105 | 125 | 145 | 163 | 183 |
| Two-stage wedge (exact) | 15 | 29 | 47 | 63 | 81 | 97 | 115 | 133 | 149 | 169 |
| Three-stage wedge (2-bit) | 30 | 66 | 102 | 138 | 176 | 216 | 254 | 292 | 330 | 368 |
| Three-stage wedge (3-bit) | 18 | 38 | 58 | 78 | 98 | 122 | 142 | 164 | 184 | 206 |
| Three-stage wedge (exact) | 14 | 28 | 42 | 56 | 70 | 88 | 102 | 116 | 132 | 146 |
| Sign based | 15 | 33 | 51 | 69 | 87 | 105 | 123 | 141 | 165 | 183 |
| Sign based (bound) | 28 | 48 | 68 | 88 | 108 | 128 | 148 | 168 | 188 | 208 |
| Majority and sign | 17 | 29 | 41 | 55 | 67 | 79 | 93 | 105 | 119 | 133 |
| Majority and sign (bound) | 22 | 35 | 48 | 62 | 75 | 88 | 102 | 115 | 128 | 141 |

Table 2 provides a number of measurements required using different methods to obtain a ⅛-accurate quantized estimate of φ with probability at least $1-\in$.

For the single-stage measurement scheme we choose $\bar{\in}=\in/2$ to estimate the sine and cosine values. For the two-stage scheme we use $\in/4$ for the sine and cosine estimation and $\in/2$ for the second stage, while for the three-stage scheme we use $\in/6$ for sine and cosine, and $\in/3$ for the last two stages. For each of the instances, the condition on n (for sufficiently large n, the error curve is piecewise convex in p) is satisfied and the numbers reported are therefore optimal for the given setting. Some reduction in the number of measurements in the box-based measurement schemes may however still be obtained by partitioning $\in$ differently over the different stages. The best results are obtained with a three-stage approach, due to the reduction in the number of samples required for the box-based part, as well the limited number of samples needed to accurately determine the sign of the cosine (see Table 1). As a final remark, note that adding more measurements can temporarily increase the error rate due to the discrete nature underlying the error curve. As an example, it can be shown that approximation of the cosine with δ=0.1 succeeds with probability at least 0.7 for all n≥110 except n ∈ {113, ..., 119}. Even though these transition regions are not always present, they do show that care needs to be taken when changing the number of samples.

Joint determination of sine and cosine error: For the box sampling scheme, we determine the number of samples required based on the maximum error probability of the cosine component over all angles. The same number of measurements is then used to independently estimate the sine component. The sine error curve is the same as the cosine error curve, but shifted by π/2. Based on FIG. 6A, we see that the error probabilities tend to complement, and that joint determination of the error should therefore help reduce the number of measurements. As shown in Table 2 (Single stage box, jointly), this is indeed the case, but the reduction is somewhat modest, and in fact, the reduced number of measurements can be no smaller than that based on the cosine error probability evaluated with $\bar{\in}=\in$ rather than $\in/2$.

Wedge-based angle: Given n measurements for both $p_x=(1+\cos(\alpha))/2$, and $p_y=(1+\sin(\alpha))/2$, we can denote by $n_x$ and $n_y$ the number of 1 measurements. The box-based approach requires that $|p_y-n_y/n|\leq\delta/2$ with high probability, and likewise for $p_x$ and $n_x/n$. This requirement enables the use of the Chernoff bound to derive a bound on the number of samples, but is otherwise too restrictive. In FIG. 5B, we see that accurate determination of the angle only needs that $(n_x, n_y)$ lie within a wedge with angles α−η and α+η centered at (n/2, n/2). The probability of success then consists of the set of points $K_{n,n}(\alpha)$ within the wedge, which strictly includes the points accepted for the box-based approach. The number of samples needed to guarantee a $1-\in$ probability of success will therefore be at least as good or smaller than the box-based approach.

Figure 7A:
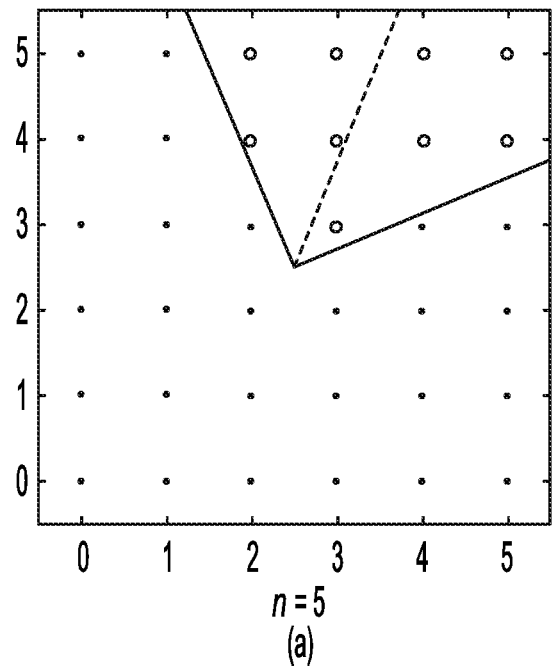
FIGS. 7A and 7B are plots showing combinations of sine and cosine measurements that estimate the angle at the center of the wedge with maximum deviation ⅛, according to an embodiment of the present invention.
Figure 7B:
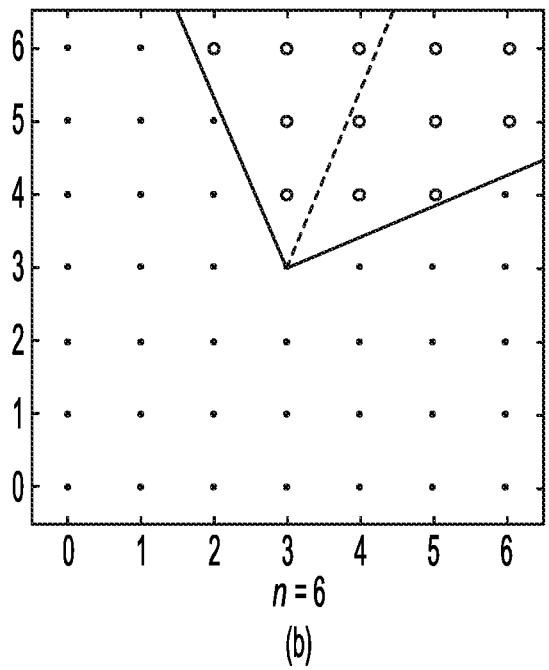

Numerical evaluation: Similar to the numerical evaluation of the box approach, in order to find the error rate corresponding to a given number of measurements n, we need to minimize Pr($K_{n,n}(\alpha)$) over α. This can be done by sweeping over the angles α, determining $K_{n,n}(\alpha)$ at each point, as illustrated in FIGS. 7A and 7B. FIGS. 7A and 7B are plots showing combinations of sine and cosine measurements that estimate the angle at the center of the wedge with maximum deviation ⅛, according to an embodiment of the present invention. An example of the resulting error probability for n=5 and η=π/4 is shown in FIG. 6B. The break-points in the curve happen at angles where grid points are on the boundary of the wedge (for even n, the origin of the wedge (n/2, n/2) is excluded and is therefore not considered to lie on the boundary).

The approach therefore is to find all angles α at which the wedge boundary intersects grid points, and evaluate the error probability at those angles, with boundary points at either the bottom or top edges omitted to obtain the limit as α approaches the critical angle from a clockwise or counter-clockwise direction. The error probability in FIG. 6B appears piecewise convex, but we did not attempt to rigorously establish this. The number of measurements determined using the above algorithm should therefore be interpreted as a lower bound for the method. The resulting number of measurements for the single-stage wedge-based approach, as well as the extension to the two- and three-stage approach described above, are listed in Table 2.

Figures 8A, 8B:
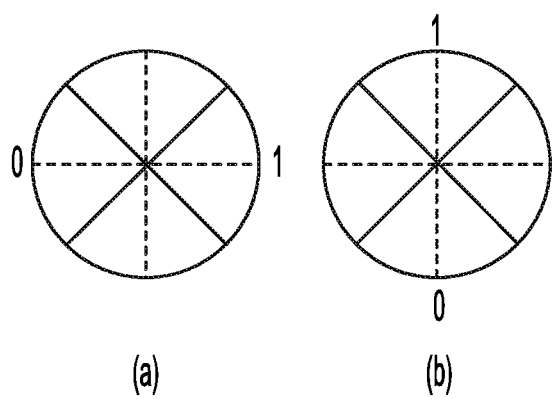
FIGS. 8A-8D are plots showing the estimation of (a) the horizontal, (b) the vertical component of the angle, accurate for angles in the shaded regions, (c) combination of the two sign-based estimates to obtain a ¼ accurate quantization, and (d) alternative quantization obtained by applying a $\pi/4$ rotation before the measurements and an inverse rotation and relabeling afterwards, according to an embodiment of the present invention.
Figure 8C:
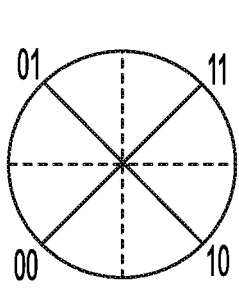
Figure 8D:
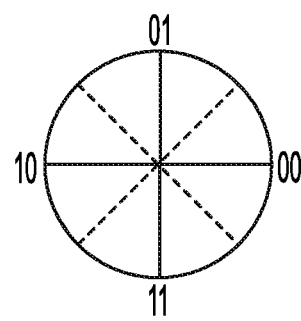

Triple-sign sampling: FIGS. 8A-8D are plots showing the estimation of (a) the horizontal, (b) the vertical component of the angle, accurate for angles in the shaded regions, (c) combination of the two sign-based estimates to obtain a ¼ accurate quantization, and (d) alternative quantization obtained by applying a π/4 rotation before the measurements and an inverse rotation and relabeling afterwards, according to an embodiment of the present invention. When angle α is at most π/4 from either 0 or π, as illustrated in FIG. 8A, the sign-based approach can be used with $p_x$ to determine with probability at least 1−$\overline{\in}$ whether the point lies on the right or left of the vertical axis. Similarly, when α is π/4 close to π/2 or 3π/2, as shown in FIG. 8B, we can tell with the same probability whether the point lies above or below the horizontal axis. When α lies outside of the given range we make no assumption on the results in either case. When applying both schemes we can combine the obtained signs, as shown in FIG. 8C. By construction we know that at least one of the two is correct, up to the desired success rate of 1−$\overline{\in}$. For angles between π/4 and 3π/4, as illustrated in the plot, this means that when the method succeeds we obtain either 01 or 11. The maximum error obtained in this case is therefore π/2. A more convenient quantization can be obtained by applying a phase shift of π/4 prior to applying the two measurement steps, followed by the inverse phase shift to the result. After changing the labels we obtain the quantization values given in FIG. 8D. To obtain a more accurate (e.g., ⅛ accurate) estimation we can apply an additional step with sign-based sampling.

For the sufficient number of measurements per component, the statement above with respect to equation (5) applied with α=π/4 gives $$n \geq \frac{\log(1/\epsilon)}{\log(1/\sin(\pi/4))} = \frac{\log(1/\epsilon)}{\log(2/\sqrt{2})} = \frac{\log(1/\epsilon)}{\log(2)-\log(2)/2} = 2\log_2(1/\epsilon). \quad (17)$$

The first stage uses n measurements each for the horizontal and vertical component. The second stage uses another n measurements, for a total of 3n measurements. For each of the three steps we can choose $\overline{\in}=\in/2$ for a total maximum error of $\in$. Note that the maximum error in the first stage is $\overline{\in}$, since one of the two components is irrelevant (although we do not know which of the two it is). Combined we can take $$N=3[2\log_2(1/\in)] \leq 9+6\log_2(1/\in), \quad (18)$$

where the inequality is due to the addition of 3 to account for rounding to integers.

Figures 9A, 9B, 9C:
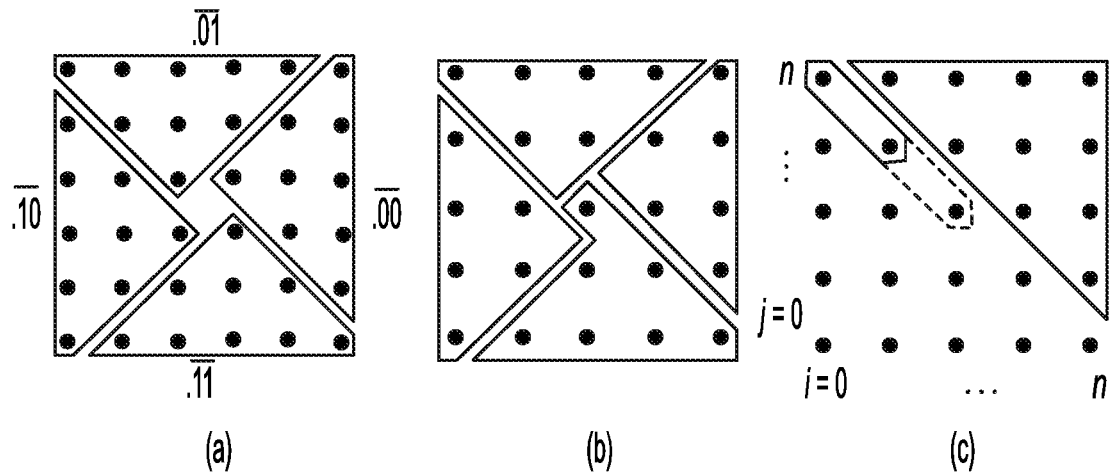
FIGS. 9A-9C are plots of classification regions for majority-based sampling for (a) odd, and (b) even n; and (c) the success set $K_n$ for angles in the range $[0, \pi/2)$, according to an embodiment of the present invention.

The majority sampling method: In an embodiment, for majority sampling, we take n measurements for the sine and cosine components, and count the number of positive measurements by $n_y$ and $n_x$, respectively. FIGS. 9A-9C are plots of classification regions for majority-based sampling for (a) odd, and (b) even n; and (c) the success set $K_n$ for angles in the range [0, π/2), according to an embodiment of the present invention. The quantized approximation of the angle is defined in terms of the majority of the number of 0 or 1 measurements $$q(n_x, n_y) \begin{cases} \overline{.00} & n_x \geq \max\{n_y, n-n_y+1\} \\ \overline{.01} & n_y \geq \max\{n_x+1, n-n_x\} \\ \overline{.10} & n-n_x \geq \max\{n_y+1, n-n_y\} \\ \overline{.11} & \text{otherwise,} \end{cases}$$

which gives partitions as illustrated in FIGS. 9A and 9B. We want to obtain an estimator that is ¼ accurate with probability at least 1−$\in$. In particular, we allow angles φ ∈ [0, ¼) to be quantized as either $\overline{0.00}$ or $\overline{0.01}$, and similarly for interval increments of ¼. We denote by $K_{ab}$ the set of points that map to .ab, this gives a success set of $K_{00} \cup K_{01}$. For the analysis of the error we work with a reduced set $K'_n=\{(i, j)|i, j \in [0, n], j \geq n-i+1\}$, illustrated by the top-right triangle in FIG. 9C.

Based on the above, we have the following result (which can be verified in below paragraphs). If we let $K_n=\{(i, j)|i, j \in [0, n], j \geq n-i+1\}$, then for all α ∈ [0, π/2]

$$1 - Pr(K_n|n, \alpha) \leq \frac{2}{2^n}.$$

Figure 10:
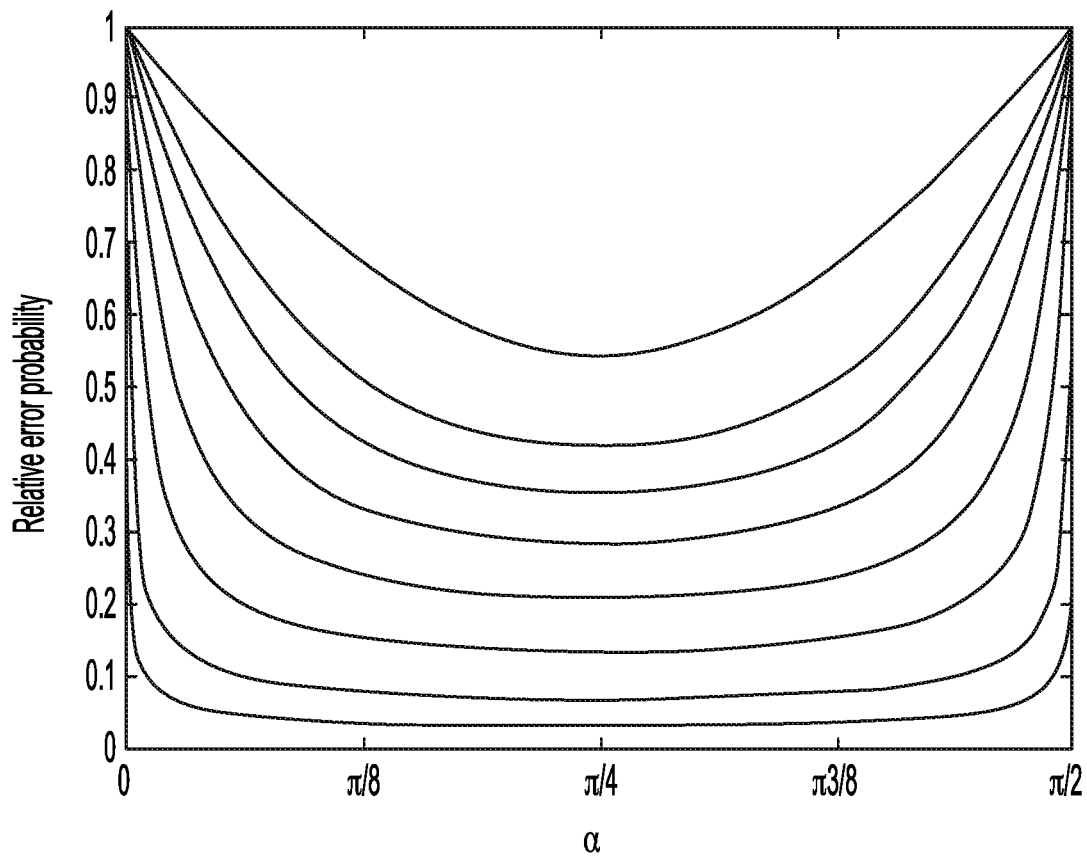
FIG. 10 is a plot of error probability $f_n(\alpha)$ scaled by $2^n$, with from top to bottom n=1, 2, 3, 5, 10, 25, 100, 500, according to an embodiment of the present invention.

We expect that this result can be improved by a factor of two. FIG. 10 is a plot of error probability $f_n(\alpha)$ scaled by $2^n$, with from top to bottom n=1, 2, 3, 5, 10, 25, 100, 500, according to an embodiment of the present invention. The error probability can be defined by the following equation $$f_n(\alpha)=1-Pr(K_n|n, \alpha) \quad (19)$$

over angles α=2πφ. As shown in FIG. 10, the error curves are convex and attain the maximum at α=0. The error probability is the summation of the probabilities for (i, j) ∉ $K_n$. At α=0, we have $p_x=1$, which implies that all terms including $(1-p_x)^{n-i}$ are zero, except those with i=n. The only such point is (n, 0), and we therefore have $$f_n(0)=(1-p_y)^n=(1-1/2)^n=2^{-n}.$$

We can now expand $K_n$ with any of the points in the gray part of the diagonal in FIG. 9C. This lowers the error for α>0 but does not affect $f_n(0)$. Under the assumption that the maximum of $f_n(\alpha)$ is attained at α=0, the maximum error for the set $K_{00} \cup K_{01}$ is therefore $2^{-n}$. By rotational symmetry the same applies for the remaining quadrants, including the special case of $K_{11}$ for even n. Extending $K_n$ only decreases the error and the result in the above statement with respect to the error probability continues to hold. The error probability for the majority-based approach over all angles is therefore bounded by $2/2^n$, which can likely be improved to $½^n$. The approach requires n samples in both the horizontal and vertical direction therefore amounting to a total of N=2n samples. In order to achieve an accuracy of ⅛, we combine the majority-based approach with a single stage of sign determination. The resulting number of samples for different values of $\in$ is listed in Table 2. A theoretical bound on the number of samples can be found using (equation 17), giving $$N=2[\log_2(4/\in)]+[2\log_2(2/\in)] \leq 9+4\log_2(1/\in).$$

This bound can be lowered by two samples if it can be shown that α=0 maximizes $f_n(\alpha)$ over [0, π/2].

Evaluation of $N_\in$: For a given $\in$ we can first determine $k_\in$ using (12) and set $\overline{\in}=\in/k_\in$. We denote by $N_k$ the number of samples in steps k=1, . . . , $k_\in$−1. For the first step we can either use the triple-sign (s) or majority (m) based approaches giving respectively $$N_1^s=9+6\log_2(1/\overline{\in}), \text{ or } N_1^m=9+4\log_2(1/\overline{\in}). \quad (20)$$

For the remaining steps we use the sign-based approach with angles $\alpha=\pi/2^{k-1}$. Using the statement above with respect to equation (5), and ignoring rounding up to the nearest integer we can take $$N_k = \frac{\log(1/\bar{\epsilon})}{\log(1/\sin(\pi/2^{k+1}))} \le \frac{\log(1/\bar{\epsilon})}{\log(2^{k-1})} = \frac{\log_2(1/\bar{\epsilon})}{k-1},$$

where the inequality follows from $\sin(\pi/2^{k+1}) \le \pi/2^{k+1} \le 4/2^{k+1}=1/2^{k-1}$. Summing over $N_k$ gives $$\sum_{k=2}^{k_\epsilon-1} N_k = \log_2(1/\bar{\epsilon}) \sum_{k=1}^{k_\epsilon-2} \left(\frac{1}{k}\right) \le \log_2(1/\bar{\epsilon}) \left(1 + \int_1^{k_\epsilon-2} x^{-1} dx\right) = \tag{21}$$

$$\log_2(1/\bar{\epsilon})(1 + \log(k_\epsilon - 2))$$

To account for rounding up of the intermediate values we add one for each of the remaining $k_\epsilon-2$ steps. Combining equations (20), (21), and the rounding term, and using $\log_2(1/\bar{\epsilon})=\log_2(1/\epsilon)+\log_2(k_\epsilon))$ gives $$N_\epsilon^s \le 7+k_\epsilon+(7+\log(k_\epsilon-2))\cdot(\log_2(1/\epsilon)+\log_2(k_\epsilon)) \tag{22}$$

for triple-sign based sampling and $$N_\epsilon^m \le 7+k_\epsilon+(5+\log(k_\epsilon-2))\cdot(\log_2(1/\epsilon)+\log_2(k_\epsilon)) \tag{23}$$

for majority-based sampling.

Figure 11A:
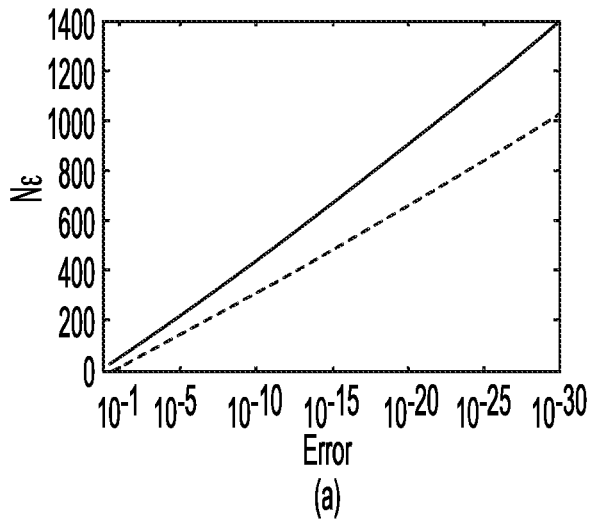
FIGS. 11A and 11B are plots of the numerical evaluation of $N_\in$ along with the theoretical upper bound, using (a) triple-sign sampling, and (b) majority-based sampling, respectively, according to an embodiment of the present invention.
Figure 11B:
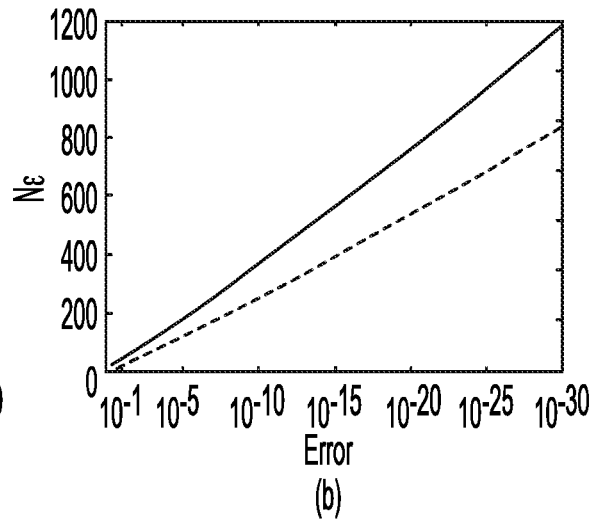

Numerical evaluation: For a numerical evaluation of $N_\epsilon$ we first determine the critical iteration $k_\epsilon$ by finding the smallest integer k that satisfies equation (11). Based on $k_\epsilon$ we set $\bar{\epsilon}=\epsilon/k_\epsilon$ and use both the triple-sign and majority-based sampling methods for the first iteration. After that we use sign-based sampling with increasingly accurate phase shifts to obtain the total number of evaluations before reaching iteration $k_\epsilon$. The resulting values for $N_\epsilon$ are plotted in FIGS. 11A and 11B along with the theoretical bounds given in equations (22) and (23). FIGS. 11A and 11B are plots of the numerical evaluation of $N_\epsilon$ along with the theoretical upper bound, using (a) triple-sign sampling, and (b) majority-based sampling, respectively, according to an embodiment of the present invention.

A summary of $k_\epsilon$ for different values of $\epsilon$ as well as $N_\epsilon$ values for the two different sampling methods used in the first iteration is given in Table 3.

TABLE 3

| Description | $10^{-1}$ | $10^{-2}$ | $10^{-3}$ | $10^{-4}$ | $10^{-5}$ | $10^{-6}$ | $10^{-7}$ | $10^{-8}$ | $10^{-9}$ | $10^{-10}$ |
|---|---|---|---|---|---|---|---|---|---|---|
| $k_\epsilon$ using (11) | 3 | 5 | 7 | 9 | 10 | 12 | 14 | 16 | 17 | 19 |
| $k_\epsilon$ using (12) | 4 | 6 | 7 | 9 | 11 | 12 | 14 | 16 | 17 | 19 |
| $N_\epsilon^s$ (triple-sign) | 24 | 56 | 84 | 116 | 147 | 177 | 213 | 243 | 280 | 314 |
| $N_\epsilon^s$ (triple-sign, bound (22)) | 44 | 84 | 123 | 163 | 197 | 237 | 277 | 317 | 353 | 394 |
| $N_\epsilon^m$ (majority) | 24 | 48 | 72 | 96 | 121 | 147 | 175 | 199 | 226 | 256 |
| $N_\epsilon^m$ (majority, bound (23)) | 34 | 66 | 98 | 130 | 158 | 190 | 223 | 256 | 285 | 319 |

Table 3 is a summary of $k_\epsilon$ for different values of $\epsilon$ as well as $N_\epsilon$ values for different sampling methods.

Finally, Table 4 provides the total number of iterations needed to obtain a $2^{-(m+2)}$ accurate phase estimate with probability at least $1-\epsilon$ up to and including iteration $k_\epsilon$. For each combination of $\epsilon$ and m that contains a number, we choose $\bar{\epsilon}=\epsilon/m$. The dashed fields are in the regime where a single measurement can be taken per additional bit of the estimated angle, without having to change $\bar{\epsilon}$.

TABLE 4

Number of samples required to obtain a $2^{-(m+2)}$ accurate estimation of $\varphi$ with probability at least $1-\epsilon$ using triple-sign based sampling (top) and majority-based sampling (bottom). Dashed lines indicate the regime where a single extra measurement is needed for each successive m.

| $\epsilon$ | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| | | | | | | | | | Triple-sign sampling | | | | | | | | | | |
| $10^{-1}$ | 15 | 16 | 19 | — | — | — | — | — | — | — | — | — | — | — | — | — | — | — | — |
| $10^{-2}$ | 33 | 36 | 41 | 42 | 45 | — | — | — | — | — | — | — | — | — | — | — | — | — | — |
| $10^{-3}$ | 51 | 58 | 61 | 66 | 69 | 70 | 73 | — | — | — | — | — | — | — | — | — | — | — | — |
| $10^{-4}$ | 69 | 78 | 83 | 86 | 89 | 94 | 97 | 98 | 99 | — | — | — | — | — | — | — | — | — | — |
| $10^{-5}$ | 87 | 98 | 105 | 110 | 113 | 116 | 119 | 122 | 127 | 130 | — | — | — | — | — | — | — | — | — |
| $10^{-6}$ | 105 | 118 | 125 | 132 | 137 | 140 | 145 | 150 | 153 | 156 | 159 | 160 | — | — | — | — | — | — | — |
| $10^{-7}$ | 123 | 138 | 147 | 154 | 161 | 166 | 169 | 172 | 175 | 178 | 183 | 186 | 189 | 190 | — | — | — | — | — |
| $10^{-8}$ | 141 | 158 | 169 | 178 | 185 | 190 | 195 | 198 | 203 | 206 | 209 | 212 | 215 | 218 | 219 | 220 | — | — | — |
| $10^{-9}$ | 165 | 184 | 199 | 208 | 215 | 220 | 225 | 230 | 233 | 236 | 239 | 242 | 245 | 248 | 251 | 254 | 257 | — | — |
| $10^{-10}$ | 183 | 206 | 219 | 228 | 235 | 242 | 247 | 252 | 259 | 264 | 267 | 272 | 275 | 278 | 281 | 284 | 287 | 290 | 291 |
| | | | | | | | | | Majority-based sampling | | | | | | | | | | |
| $10^{-1}$ | 17 | 20 | 25 | — | — | — | — | — | — | — | — | — | — | — | — | — | — | — | — |
| $10^{-2}$ | 29 | 34 | 43 | 44 | 49 | — | — | — | — | — | — | — | — | — | — | — | — | — | — |
| $10^{-3}$ | 41 | 50 | 57 | 62 | 69 | 70 | 73 | — | — | — | — | — | — | — | — | — | — | — | — |

TABLE 4-continued

Number of samples required to obtain a $2^{-(m+2)}$ accurate estimation of $\varphi$ with probability
at least $1 - \epsilon$ using triple-sign based sampling (top) and majority-based sampling (bottom).
Dashed lines indicate the regime where a single extra measurement is needed for each successive m.

| | m | | | | | | | | | | | | | | | | | | |
|---|---|---|---|---|---|---|---|---|---|---|---|---|---|---|---|---|---|---|---|
| $\epsilon$ | 1 | 2 | 3 | 4 | 5 | 6 | 7 | 8 | 9 | 10 | 11 | 12 | 13 | 14 | 15 | 16 | 17 | 18 | 19 |
| $10^{-4}$ | 55 | 68 | 73 | 80 | 83 | 88 | 93 | 96 | 97 | — | — | — | — | — | — | — | — | — | — |
| $10^{-5}$ | 67 | 82 | 91 | 98 | 101 | 106 | 109 | 114 | 119 | 122 | — | — | — | — | — | — | — | — | — |
| $10^{-6}$ | 79 | 96 | 107 | 114 | 121 | 124 | 131 | 136 | 141 | 144 | 147 | 148 | — | — | — | — | — | — | — |
| $10^{-7}$ | 93 | 112 | 123 | 132 | 139 | 146 | 151 | 154 | 157 | 160 | 167 | 170 | 173 | 176 | — | — | — | — | — |
| $10^{-8}$ | 105 | 126 | 141 | 150 | 159 | 166 | 171 | 174 | 181 | 184 | 189 | 192 | 195 | 198 | 199 | 200 | — | — | — |
| $10^{-9}$ | 119 | 142 | 159 | 170 | 179 | 184 | 189 | 196 | 201 | 204 | 207 | 210 | 213 | 216 | 219 | 224 | 227 | — | — |
| $10^{-10}$ | 133 | 160 | 173 | 186 | 193 | 200 | 209 | 214 | 221 | 226 | 229 | 234 | 239 | 244 | 247 | 250 | 253 | 256 | 257 |

Discussion: In the above paragraphs, we have analyzed several sampling schemes for use in quantum phase estimation, including quantum phase estimation based on Kitaev algorithm, and show that using previous phase estimates to shift the phase can reduce the number of measurements. Based on this we show that we can obtain a theoretical sampling complexity $N_\in + m$ to obtain a $2^{-(m+2)}$ accurate estimation of the phase $\varphi$ with probability at least $\in$. The present methods according to embodiments of the present invention (including the majority sampling method) can also take advantage of increasingly accurate rotations of the quantum phase to further narrow the estimate of the quantum phase. Even with practical limitations on the phase shift accuracy, the present sampling schemes can still reduce the number of measurements, as shown, for example, in Table 1. From a theoretical point of view, having a limited accuracy re-introduces a log(m) dependency in the algorithmic complexity, and it may therefore be interesting to analyze the application of the sampling schemes to the phase estimation to enable faster quantum phase estimation.

The maximum of $f_n(\alpha)$ in (19) over $[0, \pi/2]$ is attained at $\alpha=0$. This confirms a sampling complexity of $2 \log_2(1/\in)$ for the majority-based approach. This can be verified for $n=1$ and $n=2$, and FIG. 9 indicates this holds for all n. Indeed, for $n=1$ we have $$f_n(\alpha) = (1 - \sin(\alpha) - \cos(\alpha) - \sin(\alpha)\cos(\alpha))/4,$$

which is convex over the given range due to concavity of the trigonometric terms, and the result therefore follows from the symmetry $f_n(\alpha) = f_n(\pi/2 - \alpha)$. Empirically, the error functions for box-, wedge-, and majority-based sampling all exhibit convexity or piecewise convexity. This may indicate a more general relationship between the error over certain index sets K and $\alpha$.

The maximum deviation $\delta(\eta)$ allowed in the sine and cosine estimates to reach the desired accuracy in the angle is provided by the following: For any $0 \leq \eta \leq \pi/2$ we can compute an estimate $\bar{\varphi}$ of any $\varphi \in [0, 2\pi]$ with accuracy $|\bar{\varphi} - \varphi| \leq \eta$ from sine and cosine estimates $\tilde{c}$ and $\tilde{s}$ with $|\tilde{c} - \cos(\varphi)| \leq \delta$ and $|\tilde{s} - \sin(\varphi)| \leq \delta$, whenever $$\delta \leq \delta(\varphi) = \frac{\sin(\eta)}{\sqrt{2}} \tag{24}$$

For uniform estimation over $\varphi$ this bound is tight.

The above can be verified as follows. For $\eta=0$ the result holds trivially with $\delta=0$, and we therefore only need to consider $\eta > 0$. We can recover any $\varphi$ with accuracy $\eta$ from approximate sine and cosine values $\tilde{c}$ and $\tilde{s}$ if and only if ($\tilde{c}$, $\tilde{s}$) lies within a wedge of angles between $\varphi - \eta$ and $\varphi + \eta$ (illustrated by the shaded region in FIGS. 5A and 5B). For $\delta$, this means that the square with sides $2\delta$ centered on $\varphi$ must lie within the wedge. For $0 < \eta \leq \pi/4$ we can assume without loss of generality that $\varphi \in [0, \pi/4]$. It can be seen that the intersection of the top-left corner of the box, at $(\cos(\varphi) - \delta, \sin(\varphi) + \delta)$, with the boundary of the wedge at angle $\varphi + \eta$ determines the maximum value of $\delta$. Formalizing, we write $\delta(\varphi)$ to indicate the dependence on $\varphi$ and denote the wedge boundary as $x = \alpha(\varphi)y$, with $$\alpha(\varphi) = \frac{\cos(\varphi + \eta)}{\sin(\varphi + \eta)}$$

For $\delta$ to be valid we need $\cos(\varphi) - \delta \geq \alpha(\varphi)(\sin(\varphi) + \delta)$, which can be rewritten as $$\delta \leq \delta(\varphi) = \frac{\cos(\varphi) - \alpha(\varphi)\sin(\varphi)}{1 + \alpha(\varphi)} \tag{25}$$

We then need to minimize $\delta(\varphi)$ over the given range of $\varphi$ to find the largest value of $\delta$ that applies for all $\varphi$. Abbreviating $\alpha = \alpha(\varphi)$ and gradient $\alpha' = \alpha'(\varphi)$, we have $$= -\sin(\varphi)\left(\frac{1}{1+\alpha} - \frac{\alpha'}{(1+\alpha)^2}\right) - \cos(\varphi)\left(\frac{\alpha}{1+\alpha} - \frac{\alpha'}{(1+\alpha)^2}\right) \tag{26}$$

From $$\alpha' = -\frac{1}{\sin^2(\varphi - \eta)},$$

and $\alpha^2 = \frac{\cos^2(\varphi + \eta)}{\sin^2(\varphi + \eta)} = \frac{1 - \sin^2(\varphi + \eta)}{\sin^2(\varphi + \eta)} = \frac{1}{\sin^2(\varphi + \eta)} - 1,$ It follows that $\alpha' + \alpha^2 = 1$, or $\alpha' = -1 - \alpha^2$, which allows us to simplify the sine coeffient as $$\frac{1}{1+\alpha} + \frac{\alpha'}{(1+\alpha)^2} = \frac{1+\alpha}{(1+\alpha)^2} - \frac{1+\alpha^2}{(1+\alpha)^2} = \frac{\alpha(1-\alpha)}{(1+\alpha)^2}, \tag{27}$$

Whereas for the cosine coefficient we find $$\frac{\alpha}{1+\alpha} + \frac{\alpha'}{(1+\alpha)^2} = \frac{\alpha + \alpha^2 + \alpha'}{(1+\alpha)^2} = \frac{(\alpha-1)}{(1+\alpha)^2}. \qquad (28)$$

Substituting (27) and (28) in (26) gives $$\delta'(\phi) = \cos(\phi)\frac{(1-\alpha)}{(1+\alpha)^2} - \alpha\sin(\phi)\frac{(1-\alpha)}{(1+\alpha)^2}. \qquad (29)$$

Noting that $\eta>0$ and considering the range of $\phi$, we have $0<\sin(\phi+\eta)\le 1$. This allows us to multiply the first term in (29) by $\sin(\phi+\eta)/\sin(\phi+\eta)$, and expand the enumerator in this term using the sum formula as $$\sin(\phi+\eta)=\sin(\phi)\cos(\eta)+\cos(\phi)\sin(\eta)$$

Finally, expanding the numerator $\cos(\phi+\eta)$ in the a term preceding $\sin(\phi)$ as $$\cos(\phi+\eta)=\cos(\phi)\cos(\eta)-\sin(\phi)\sin(\eta)$$

and simplifying gives $$\delta'(\phi) = \frac{(1-\alpha)}{(1+\alpha)^2 \sin(\phi+\eta)}\sin(\eta). \qquad (30)$$

All terms in this expression, except $\alpha-1$, are strictly positive. The gradient is therefore zero only when $\alpha=1$, which happens at $\phi^*=\pi/4-\eta$. For $\phi<\phi^*$ we have $\alpha(\phi)>1$ and therefore $\delta'(\phi)<0$, whereas for $\phi>\phi^*$ we have $\alpha(\phi)<1$ and $\delta'(\phi)>0$, which shows that $\phi^*$ gives a minimizer. Evaluating $\delta(\phi^*)$ in (25) and noting that $\alpha(\phi^*)=1$ then gives $$\delta \le \delta(\phi) = (\cos(\pi/4-\eta)-\sin(\pi/4-\eta))/2$$

To obtain the desired result, we simplify $\delta(\phi)$ using the sum formulas and $\cos(\pi/4)=\sin(\pi/4)=\sqrt{2}/2$:

$$\delta(\phi) = \frac{1}{2}\left(\left(\cos\left(\frac{\pi}{4}\right)\cos(\eta) + \sin\left(\frac{\pi}{4}\right)\sin(\eta)\right) - \right.$$
$$\left.\left(\sin\left(\frac{\pi}{4}\right)\cos(\eta) - \cos\left(\frac{\pi}{4}\right)\sin(\eta)\right)\right)$$
$$= \frac{\sqrt{2}}{4}((\cos(\eta)+\sin(\eta))-(\cos(\eta)-\sin(\eta))) = \frac{1}{\sqrt{2}}\sin(\eta).$$

For $\pi/4 \le \eta \le \pi/2$ we can assume without loss of generality that $\phi \in [-\pi/4, 0]$. In this case the top-left corner of the box can again be seen to limit $\delta$. The argument as given above follows through as is, thus completing the above verification.

For sufficiently large n, the error curve is piecewise convex in p, provided as follows: If we choose $\delta>0$ and let $f_n(p)=1-\Pr(X \in K_n, \delta(p))$ with $K_{n,p}$ as defined in (16). Then for $n \ge \max\{1+1/\delta^2, 3\}$, $f_n(p)$ is piecewise convex on [0, 1] with breakpoints at $[0,1] \cap \{(k/n)\pm\delta/2\}k\in[n]$.

The above statement can be verified as follows. From the definition of $K_{n,\delta}(p)$, it is clear that $K_{n,\delta}(p)$ remains constant precisely on the (open) segment between the stated breakpoints. Choose any segment, then for all values of p within this segment, the error is obtained by summing $B(k; n, p)$ over $k \notin K_{n,\delta}(p)$, with $$B(k; n, p) = \binom{n}{k} p^k (1-p)^{n-k}.$$

In order to prove convexity of the error over the segment, we show that the each of the terms $B(k; n, p)$ is convex in p over the segment. For conciseness we normalize with respect to the binomial coefficient and work with $$B(k; n, p) := B(k; n, p) = \binom{n}{k}.$$

For $n=2$, observe that the second derivative $B''_{1,2}(p)=-2$ is negative, which means that $B_{1,2}(p)$ is concave. We, therefore, require that $n \ge 3$. For $k=0$ and $k=n$ we find $$B''_{0,n}(p)=n(n-1)(1-p)^{n-2}, \text{ and } B''_{n,n}(p)=n(n-1)p^{n-2}.$$

The second derivatives are non-negative over the domain $p \in [0, 1]$ and the functions are therefore convex. For $0<k<n$ we have $$B'_{k,n}(p) = (k(1-p) - (n-k)(p))\left(p^{k-1}(1-p)^{n-k-1}\right) \qquad (31)$$
$$= (k-np)\left(p^{k-1}(1-p)^{n-k-1}\right)$$

and the gradient reaches zero when $p=0$, $p=1$, or $p=k/n$. For $k=1$ we find $$B''_{1,n}(p) = [-n(1-p) - (1-np)(n-2)](1-p)^{n-3}$$
$$= [np(n-1) - 2(n-1)](1-p)^{n-3}$$

For convexity we want $B''_{1,n}(p) \ge 0$, and therefore require that the square-bracketed term be nonnegative. Solving for p then gives convexity of $B''_{1,n}(p)$ for $p \ge 2/n$. By symmetry, it follows that for $k=n-1$, $B''_{n-1,n}(p)$ is convex for $p \le 1-2/n$. Finally, for $2 \le k \le n-2$ it follows from (31) that $$B''_{k,n}(p) = (-np(1-p) + (k-np)((k-1)(1-p) -$$
$$(n-k-1)p)) \cdot \left(p^{k-2}(1-p)^{n-k-2}\right)$$
$$= [n(n-1)p^2 - 2k(n-1) + k(k-1)] \cdot \left(p^{k-2}(1-p)^{n-k-2}\right).$$

The term in square brackets is a quadratic in p, and solving for the roots gives $$p\pm = \frac{k}{n} \pm \frac{\sqrt{k(n-1)(n-k)}}{n(n-1)}.$$

The deviation is maximum at $k=n/2$, which gives $$\frac{\sqrt{k(n-1)(n-k)}}{n(n-1)} \le \frac{\binom{n}{2}\sqrt{n-1}}{n(n-1)} = \frac{1}{2\sqrt{n-1}}.$$

The second derivative $B''_{k,n}$ is therefore guaranteed to be nonnegative, and $B_{k,n}$ convex, when p is at least $1/(2\sqrt{n-1})$ away from the maximum at k/n. It can be verified that the same sufficient condition applies for k=0 and k=n.

For any p in the selected segment we know that $K_{n,\delta}(p)$ remains constant and that $|k/n-p|\geq\delta/2$ for any $k \notin K_{n,\delta}(p)$. To guarantee convexity we therefore require that $$\delta/2 \geq 1/(2\sqrt{n-1})$$

which simplifies to $n \geq 1+1/\delta^2$.

The following statement regarding the error probability can also be verified. If we let $K_n=\{(i,j)|i,j \in [0,n], j \geq n-i+1\}$, then for all $\alpha \in [0, \pi/2]$ $$1 - Pr(K_n | n, a) \leq \frac{2}{2^n}$$

For example, if we denote by $\varepsilon_n=\{(i,j)|i,j \in [0, n], i+j \leq n\}$ the complement of $K_n$. The error probability $Pr(\varepsilon_n|n, \alpha)=1 Pr(Kn|n, \alpha)$ is then obtained by summing $f_{i,j}$ over $(i, j) \in \varepsilon_n$, where $$f_{i,j}(\alpha) = \binom{n}{i}\binom{n}{j} p_x^i (1-p_x)^{n-i} p_y^j (1-p_y)^{n-j}$$

Defining the diagonal sums $k \in [0, n]$ as $$d_k(\alpha) = \sum_{i=0}^{k} f_{i,k-i}(\alpha),$$

we can equivalently write $Pr(\varepsilon_n|n, \alpha) = \Sigma_{k=0}^n d_k(\alpha)$. For $\alpha \in [0, \pi/2]$ it is easily seen that $dk(\alpha)=dk(\pi/2-\alpha)$, and it therefore suffices to show the desired result for $\alpha \in [0, \pi/4]$. As a first step, we bound the value of the main diagonal $d_n$ by $2^{-n}$:

$$d_n(\alpha) = \sum_{j=0}^{n} \binom{n}{n-j}\binom{n}{j} p_x^{n-j}(1-p_x)^j p_y^j (1-p_y)^{n-j} \quad (32)$$

$$= (p_x(1-p_y))^n \sum_{j=0}^{n} \binom{n}{j}^2 \left(\frac{p_y(1-p_x)}{p_x(1-p_y)}\right)^j$$

$$= (p_x(1-p_y))^n \sum_{j=0}^{n} \left(\binom{n}{j}\left(\frac{p_y(1-p_x)}{p_x(1-p_y)}\right)^{j/2}\right)^2$$

$$\leq (p_x(1-p_y))^n \left(\sum_{j=0}^{n} \binom{n}{j}\left(\frac{\sqrt{p_y(1-p_x)}}{\sqrt{p_x(1-p_y)}}\right)^j\right)^2$$

$$\stackrel{(i)}{=} (p_x(1-p_y))^n \left(1 + \frac{\sqrt{p_y(1-p_x)}}{\sqrt{p_x(1-p_y)}}\right)^{2n}$$

$$\stackrel{(ii)}{=} (p_x(1-p_y))^n \left(\frac{1}{2p_x(1-p_y)}\right)^n$$

$$= 2^{-n},$$

where (i) uses the binomial theorem and (ii) follows from the observation that $$\left(1 + \frac{\sqrt{p_y(1-p_x)}}{\sqrt{p_x(1-p_y)}}\right)^2 = \left(\frac{\sqrt{p_x(1-p_y)} + \sqrt{p_y(1-p_x)}}{\sqrt{p_x(1-p_y)}}\right)^2$$

$$= \frac{p_x(1-p_y) + 2\sqrt{p_x(1-p_x)p_y(1-p_y)} + p_y(1-p_x)}{p_x(1-p_y)}$$

$$\stackrel{(8)}{=} \frac{p_x(1-p_y) + 2\sqrt{\sin^2(\alpha)\cos^2(\alpha)/16} + p_y(1-p_x)}{p_x(1-p_y)}$$

$$= \frac{(1+\cos(\alpha))(1-\sin(\alpha))/4 + \sin(\alpha)\cos(\alpha)/2 + (1+\sin(\alpha))(1-\cos(\alpha))/4}{p_x(1-p_y)}$$

$$= \frac{1}{2p_x(1-p_y)}.$$

For the second step we derive a bound on $d_{n-1}$ based on $d_n$, from which we then obtain a bound on $d_{n-1}+d_n$. For $i \geq 1$ we have $$f_{i-1,j} = f_{i,j} \cdot \frac{1-p_x}{p_x} \cdot \frac{i}{n-i+1}.$$

The right-most term, which accounts for the change in the binomial coefficient $$\binom{n}{i},$$

is less than or equal to 1 for $i \leq n/2$ when n is even, and for $i \leq (n+1)/2$ when n is odd. A similar argument applies for the transition from $f_{i,j}$ to $f_{i,j}-1$ for $1 \leq j \leq (n+1)/2$, allowing us to bound the elements on the (n−1)-diagonal $d_n-1$ as follows:

$$f_{i,j} \leq \begin{cases} \frac{1-p_x}{p_x} f_{i+1,j} & i < (n-1)/2, \\ \frac{1-p_y}{p_y} f_{i+i,j} & \text{otherwise.} \end{cases}$$

Figure 12A:
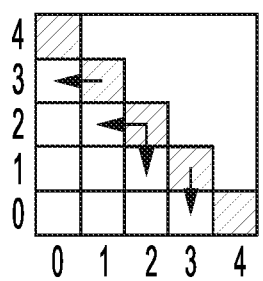
FIGS. 12A-12D show constructions for bounding (a,b) $d_n-1$ based on $d_n$, and (c,d) the sum of $d_k$ for strided k, according to an embodiment of the present invention.
Figure 12B:
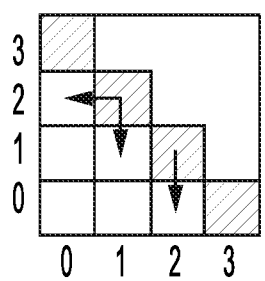
Figure 12C:
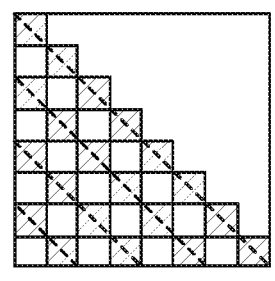
Figure 12D:
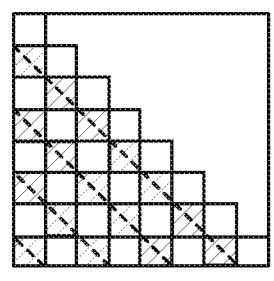

FIGS. 12A-12D show constructions for bounding (a,b) $d_n-1$ based on $d_n$, and (c,d) the sum of $d_k$ for strided k, according to an embodiment of the present invention. As illustrated in FIGS. 12A and 12B, this approach uses the middle element of the main diagonal twice. Taking this into account, and effectively doing the same for all elements, we have $$d_{n-1} \leq \left(\frac{1-p_x}{p_x} + \frac{1-p_y}{p_y}\right)d_n = \frac{p_y(1-p_x) + p_x(1-p_y)}{p_x p_y} d_n. \quad (33)$$

Combining (32) and (33) we have $$d_n + d_{n-1} \leq \frac{p_x + p_y - p_x p_y}{p_x p_y} \cdot 2^{-n}. \quad (34)$$

As the third step, we derived bound on $d_k-2$ based on $d_k$. Consider any diagonal $2 \leq k \leq n$, with $0 < i < k$ and $j=k-i$, then $$\binom{n}{i-1}\binom{n}{j-1} =$$

$$\binom{n}{i-1}\binom{n}{k-i-1} = \frac{i}{n-i+1} \cdot \frac{k-i}{n-k+i+1}\binom{n}{i}\binom{n}{k-i} = \kappa\binom{n}{i}\binom{n}{j}$$

Since $k \le n$, the multiplicative term $\kappa$ satisfies $$\kappa = \frac{i(k-i)}{i(k-i)+n(n-k+1)-k+2} \le \frac{i(k-i)}{i(k-i)+n-k+2} \le \frac{i(k-i)}{i(k-i)+2} < 1.$$

It therefore follows that $$f_{i-1,k-i-1} \le f_{i,k-1} \cdot \frac{(1-p_x)}{p_x} \cdot \frac{(1-p_y)}{p_y}.$$

Figures 13A, 13B:
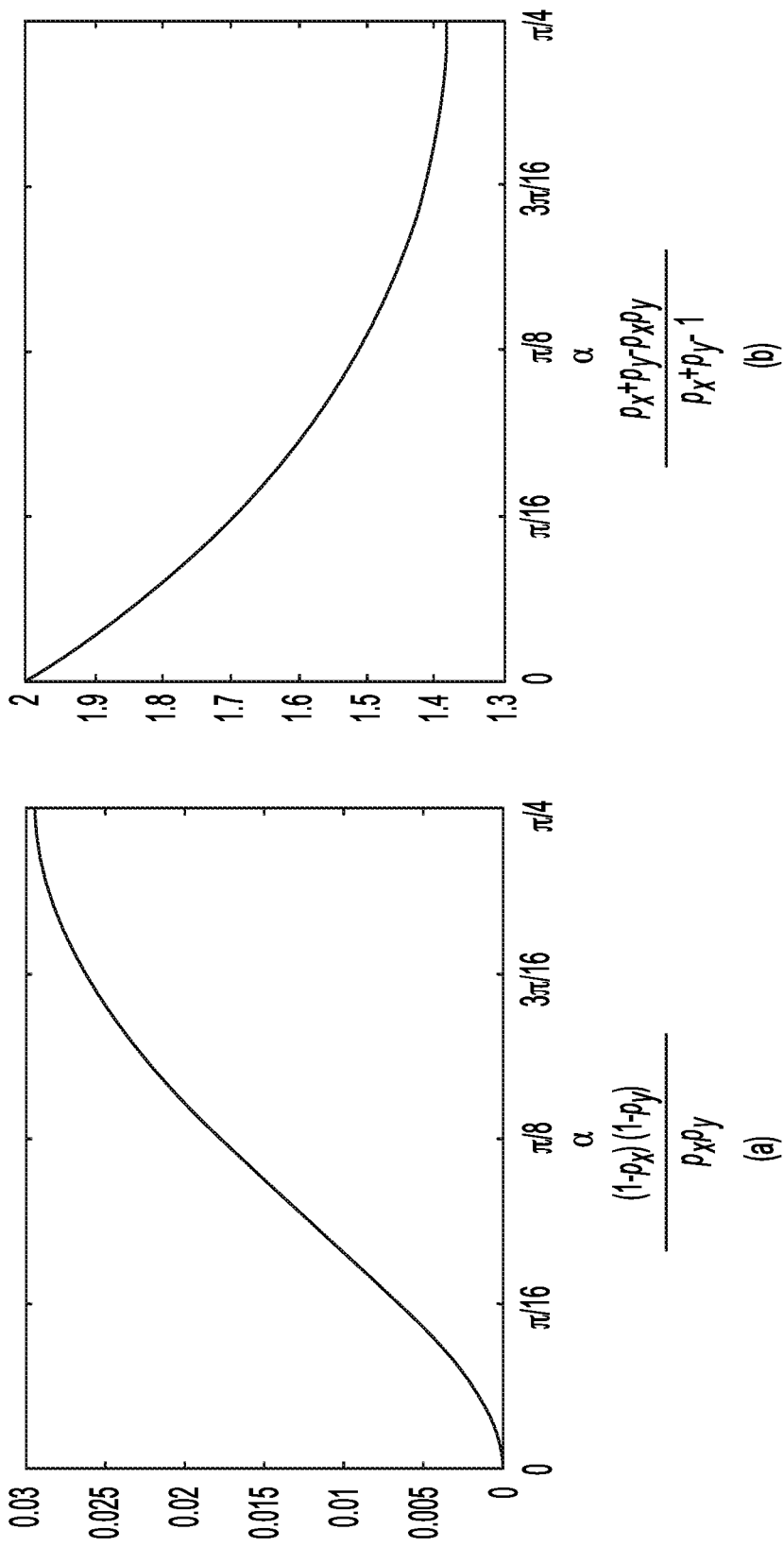
FIGS. 13A-13B are plots of key quantities used in verifying a statement with respect to error probability, according to an embodiment of the present invention.

The transition from diagonal k to k−2 follows by summing over all elements i+j=k−2, giving $$d_{k-2} \le \frac{(1-p_x)(1-p_y)}{p_x p_y} d_k = \tau d_k,$$

with $\tau < 1$, as shown in FIG. 13A. FIGS. 13A-13B are plots of key quantities used in verifying the statement with respect to the error probability, according to an embodiment of the present invention. As a fourth step we sum over the even and odd diagonals. Starting at k=n or k=n−1 we have $$\sum_{i=0}^{k/2} d_{k-2i} \le \sum_{i=0}^{\infty} \tau^i d_k = \frac{1}{1-\tau} d_k = \frac{p_x p_y}{p_x + p_y - 1} \cdot d_k$$

For the sum of the diagonals, and hence that $f_{i,j}$ over the error set set $\varepsilon_n$, it follows from equation (34) that $$\sum_{k=0}^{n} d_k \le \frac{p_x p_y}{p_x + p_y - 1}(d_n + d_{n-1}) \le \frac{p_x p_y}{p_x + p_y - 1} \cdot \frac{p_x + p_y - p_x p_y}{p_x p_y} \cdot 2^{-n} = \frac{p_x + p_y - p_x p_y}{p_x + p_y - 1} \cdot 2^{-n}.$$

The desired result then follows from the observation that $(p_x+p_y-p_xp_y)/(p_x+p_y-1) \le 2$, as illustrated in FIG. 13B.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

I claim:

1. A method for determining a quantum phase induced by a unitary operator in a quantum device, the method comprising:

providing a plurality of quantum circuits connected in series, wherein an output of a first quantum circuit in the plurality of quantum circuits is an input of a second quantum circuit in the plurality of quantum circuits; and determining a quantum phase induced by the unitary operator by performing a plurality of measurements of an output of each of the plurality of quantum circuits comprising performing a first measurement in the plurality of measurements of the quantum phase using the first quantum circuit in the plurality of quantum circuits and performing a second measurement in the plurality of measurements of the quantum phase using the second quantum circuit in the plurality of quantum circuits;

wherein a number of the plurality of quantum circuits used to determine the quantum phase depends on a number of the plurality of measurements needed to determine the quantum phase within a desired precision, wherein the number of the plurality of measurements is reduced for the desired precision by using a majority sampling method comprising:

performing a plurality of measurements for cosine and sine components of the quantum phase;

counting a number of measurements in a vertical axis for the sine component and counting a number of measurements in a horizontal axis for the cosine component; and determining the quantum phase based on a majority of a number of measurements of binary bit 0 and a number of measurements of binary 1 of the sine component and the cosine component.

2. The method according to claim 1, wherein the desired precision is at least 2 binary bits after the binary point.

3. The method according to claim 1, wherein determining the phase based on the majority of the number of measurements of binary bit 0 and the number of measurements of binary bit 1 of the sine component and the cosine component comprises determining a quantization of the quantum phase $q(n_x, n_y)$ as a function of the number of measurements $(n_y)$ in the vertical axis for the sine component and the number of measurements $(n_x)$ in the horizontal axis for the cosine component.

4. The method according to claim 3, wherein the quantization of the quantum phase $q(n_x, n_y)$ is equal to:

$\overline{0.00}$ if $n_x$ is greater than or equal to a maximum of $n_y$ and $n-n_y+1$;

$\overline{0.01}$ if $n_y$ is greater than or equal to a maximum of $n_x+1$ and $n-n_x$;

$\overline{0.10}$ if $n-n_x$ is greater than or equal to a maximum of $n_y+1$ and $n-n_y$; and $\overline{0.11}$ otherwise.

5. The method according to claim 1, wherein performing the first measurement or the second measurement comprises:

applying a first Hadamard gate to a first state of a first qubit to put the first qubit into a superposition of states;

applying a phase shift gate to the superposition of states of the first qubit to apply a first phase to the first qubit;

applying a unitary operator ($U^s$) gate to a quantum state conditioned on the first qubit to apply a second phase to the quantum state;

applying a second Hadamard gate to the first qubit;

performing a measurement on the first qubit to determine probability values of measuring an output value of one based on input values of the first phase, the probability value depending on the first phase and the second phase; and determining the second phase based on the probability values.

6. The method according to claim 1, further comprising applying a NOT gate on the first qubit after applying the second Hadamard gate.

7. The method according to claim 1, wherein determining the second phase comprises selecting a value of the first phase equal to zero radian and −¼ radian and estimating a sine and a cosine of the second phase based on probability values of obtaining an initial second phase at the selected value of the first phase.

8. The method according to claim 7, wherein applying the unitary operator ($U^s$) gate to the quantum state comprises applying the second phase multiplied by a factor that is proportional to 2 to the power j−1, wherein the second phase is expressed as a string of binary bits after the binary point and wherein j corresponds to incremental bit positions of binary bit values in the string of binary bits of the second phase.

9. The method according to claim 8, further comprising:
iteratively adding one bit to the string of binary bits of an initial second phase per step and shifting a previous bit string by one, and
repeating applying the first Hadamard gate to the first state of the first qubit; applying the phase shift gate to the superposition of states of the first qubit to apply the first phase to the first qubit; applying the unitary operator ($U^s$) gate to the quantum state conditioned on the first qubit to apply the second phase to the quantum state; applying the second Hadamard gate on the first qubit; performing the measurement on the first qubit to determine the probability values of measuring the output value of one based on the input values of the first phase, the probability value depending on the first phase and the second phase; and
determining an updated value of the second phase.

10. The method according to claim 9, further comprising:
choosing the first phase equal to the updated second phase divided by minus two to obtain an adjusted second phase that is a threshold value away from a horizontal axis;
determining a sign of a cosine of the adjusted second phase; and
setting a value of a last added binary bit in the string of binary bits of the updated second phase based on the determined sign of the cosine of the adjusted second phase.

11. The method according to claim 10, wherein if the sign of the cosine of the adjusted second phase is positive, setting the last added binary bit of the string of binary bits of the updated second phase to 0 and if the sign of the cosine of the adjusted second phase is negative, setting the last added binary bit of the string of binary bits of the updated second phase to 1.

12. The method according to claim 11, wherein determining the updated value of the second phase comprises determining with a probability equal to at least substantially one a position of the updated second phase based on the sign of the cosine relative to right or left of a vertical axis when the adjusted second phase is at most π/4 from either 0 or π, or relative to a horizontal axis when the adjusted second phase is at most π/4 from either π/2 or 3π/2, or both.

13. A method of determining a quantum phase of quantum device, comprising:
performing a plurality of measurements for cosine and sine components of the quantum phase;
counting a number of measurements in a vertical axis for the sine component and counting a number of measurements in a horizontal axis for the cosine component; and
determining the quantum phase based on a majority of a number of measurements of binary bit 0 and a number of measurements of binary bit 1 of the sine component and the cosine component.

14. The method according to claim 13, wherein determining the phase based on the majority of the number of measurements of binary bit 0 and the number of measurements of binary bit 1 of sine component and the cosine component comprises determining a quantization of the quantum phase $q(n_x, n_y)$ as a function of the number of measurements ($n_x$) in the vertical axis for the sine component and the number of measurements ($n_y$) in the horizontal axis for the cosine component.

15. The method according to claim 14, wherein the quantization of the quantum phase $q(n_x, n_y)$ is equal to:
$\overline{0.00}$ if $n_x$ is greater than or equal to a maximum of $n_y$ and $n-n_y+1$;
$\overline{0.01}$ if $n_y$ is greater than or equal to a maximum of $n_x+1$ and $n-n_x$;
$\overline{0.10}$ if $n-n_x$ is greater than or equal to a maximum of $n_y+1$ and $n-n_y$; and
$\overline{0.11}$ otherwise.

16. The method according to claim 13, further comprising:
iteratively adding one bit to the string of binary bits of an initial second phase per step and shifting a previous bit string by one, and
repeating applying the first Hadamard gate to the first state of the first qubit; applying the phase shift gate to the superposition of states of the first qubit to apply the first phase to the first qubit; applying the unitary operator ($U^s$) gate to the quantum state conditioned on the first qubit to apply the second phase to the quantum state; applying the second Hadamard gate on the first qubit; performing the measurement on the first qubit to determine the probability values of measuring the output value of one based on the input values of the first phase, the probability value depending on the first phase and the second phase; and
determining an updated value of the second phase.

17. The method according to claim 16, further comprising:
choosing the first phase equal to the updated second phase divided by minus two to obtain an adjusted second phase that is a threshold value away from a horizontal axis;
determining a sign of a cosine of the adjusted second phase; and
setting a value of a last added binary bit in the string of binary bits of the updated second phase based on the determined sign of the cosine of the adjusted second phase.

18. The method according to claim 17, wherein if the sign of the cosine of the adjusted second phase is positive, setting the last added binary bit of the string of binary bits of the updated second phase to 0 and if the sign of the cosine of the adjusted second phase is negative, setting the last added binary bit of the string of binary bits of the updated second phase to 1.

19. The method according to claim 18, wherein determining the updated value of the second phase comprises determining with a probability equal to at least substantially one a position of the updated second phase based on the sign of the cosine relative to right or left of a vertical axis when the adjusted second phase is at most $\pi/4$ from either 0 or $\pi$, or relative to a horizontal axis when the adjusted second phase is at most $\pi/4$ from either $\pi/2$ or $3\pi/2$, or both.

20. A quantum device comprising a plurality of quantum circuits for determining the quantum phase, comprising:
- a plurality of quantum circuits connected in series, wherein an output of a first quantum circuit in the plurality of quantum circuits is an input of a second quantum circuit in the plurality of quantum circuits, wherein the plurality of quantum circuits are configured and arranged to determine a quantum phase induced by a unitary operator in the quantum device by performing a plurality of measurements of an output of each of the plurality of quantum circuits comprising performing a first measurement in the plurality of measurements of the quantum phase using the first quantum circuit in the plurality of quantum circuits and performing a second measurement in the plurality of measurements of the quantum phase using the second quantum circuit in the plurality of quantum circuits;
- wherein a number of the plurality of quantum circuits used to determine the quantum phase depends on a number of the plurality of measurements needed to determine the quantum phase within a desired precision, wherein a number of the plurality of measurements is reduced for the desired precision by using a majority sampling method comprising:
  - performing a plurality of measurements for cosine and sine components of the quantum phase;
  - counting a number of measurements in a vertical axis for the sine component and counting a number of measurements in a horizontal axis for the cosine component; and
  - determining the quantum phase based on a majority of a number of measurements of binary bit 0 and a number of measurements of binary bit 1 of the sine component and the cosine component.

21. The quantum device according to claim 20, wherein the first quantum circuit or the second quantum circuit or both comprises:
- a first Hadamard gate configured to apply to a first state of a first qubit to put the first qubit into a superposition of states;
- a phase shift gate configured to apply to the superposition of states of the first qubit a first phase;
- a unitary operator ($U^s$) gate configured to apply to a quantum state conditioned on the first qubit a second phase;
- a second Hadamard gate configured to apply a second quantum phase to the first qubit;
- a measurement component configured to perform a measurement on the first qubit to determine probability values of measuring an output value of one based on input values of the first phase, the probability value depending on the first phase and the second phase.

* * * * *